US008674398B2

(12) United States Patent
Kaji et al.

(10) Patent No.: US 8,674,398 B2
(45) Date of Patent: Mar. 18, 2014

(54) GROUP III NITRIDE SEMICONDUCTOR LIGHT EMITTING DEVICE AND PRODUCTION METHOD THEREOF, AND LAMP

(75) Inventors: Hiroaki Kaji, Chiba (JP); Hisayuki Miki, Chiba (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 729 days.

(21) Appl. No.: 12/666,594

(22) PCT Filed: Jul. 3, 2008

(86) PCT No.: PCT/JP2008/062072
§ 371 (c)(1),
(2), (4) Date: Dec. 23, 2009

(87) PCT Pub. No.: WO2009/005126
PCT Pub. Date: Jan. 8, 2009

(65) Prior Publication Data
US 2010/0327311 A1    Dec. 30, 2010

(30) Foreign Application Priority Data
Jul. 4, 2007 (JP) ................. 2007-176099

(51) Int. Cl.
*H01L 33/30* (2010.01)

(52) U.S. Cl.
USPC .... 257/103; 257/201; 257/615; 257/E33.023; 257/E33.025; 257/E29.089; 438/604

(58) Field of Classification Search
USPC ............. 257/79–103, E33.028, E21.09, 201, 257/615, E33.023, E33.025, E29.089; 438/22–47, 200, 483, 513, 604
See application file for complete search history.

(56) References Cited

U.S. PATENT DOCUMENTS 6,406,931 B1 * 6/2002 Han et al. .......... 438/46
6,830,949 B2 * 12/2004 Senda et al. ........ 438/46

(Continued)

FOREIGN PATENT DOCUMENTS

DE          142966 A  *  7/1980
JP         04-297023 A    10/1992

(Continued)

OTHER PUBLICATIONS

Notice of Allowance dated May 9, 2011 for corresponding Korean Patent Application No. 10-2009-7026968.

(Continued)

*Primary Examiner* — Ermias Woldegeorgis
(74) *Attorney, Agent, or Firm* — Sughrue Mion, PLLC

(57) ABSTRACT

There are provided a group III nitride semiconductor light emitting device which is constituted of a substrate, an intermediate layer formed thereon having a favorable level of orientation properties, and a group III nitride semiconductor formed thereon having a favorable level of crystallinity, and having excellent levels of light emitting properties and productivity; a production method thereof; and a lamp,
the group III nitride semiconductor light emitting device configured so that at least an intermediate layer 12 composed of a group III nitride compound is laminated on a substrate 11, and an n-type semiconductor layer 14 having a base layer 14a, a light emitting layer 15 and a p-type semiconductor layer 16 are sequentially laminated on the intermediate layer 12,
wherein when components are separated, based on a peak separation technique using an X-ray rocking curve of the intermediate layer 12, into a broad component having the full width at half maximum of 720 arcsec or more and a narrow component, a non-orientating component that corresponds to the broad component is included in a crystal organization of the intermediate layer 12, and
a proportion of the non-orientating component within the crystal organization of the intermediate layer 12 is 30% or less in terms of an area ratio of the intermediate layer 12.

22 Claims, 7 Drawing Sheets

(56) References Cited

U.S. PATENT DOCUMENTS

| | | | |
|---|---|---|---|
| 2003/0092230 A1* | 5/2003 | Koike et al. | 438/200 |
| 2003/0109076 A1 | 6/2003 | Senda et al. | |
| 2005/0247949 A1 | 11/2005 | Senda et al. | |
| 2007/0045654 A1 | 3/2007 | Choi et al. | |
| 2008/0116478 A1* | 5/2008 | Miki et al. | 257/103 |

FOREIGN PATENT DOCUMENTS

| | | | |
|---|---|---|---|
| JP | 05-086646 B2 | | 12/1993 |
| JP | 06-120163 A | | 4/1994 |
| JP | 08-264478 A | | 10/1996 |
| JP | 09-064477 A | | 3/1997 |
| JP | 11102907 A | * | 4/1999 |
| JP | 3026087 B2 | | 1/2000 |
| JP | 2000216249 A | * | 8/2000 |
| JP | 2001-168386 A | | 6/2001 |
| JP | 2001-308010 A | | 11/2001 |
| JP | 2002-252177 A | | 9/2002 |
| JP | 2003-119564 A | | 4/2003 |
| JP | 3440873 B2 | | 6/2003 |
| JP | 2003-183823 A | | 7/2003 |
| JP | 2003-332234 A | | 11/2003 |
| JP | 2003-347584 A | | 12/2003 |
| JP | 3700492 B2 | | 7/2005 |
| JP | 2005-209925 A | | 8/2005 |
| JP | 2006-114886 A | | 4/2006 |
| JP | 2006-294861 A | | 10/2006 |
| JP | 2007-067114 A | | 3/2007 |

OTHER PUBLICATIONS

Office Action ("Notice of Reasons for Rejection") with a mailing date of Nov. 27, 2012 for corresponding Japanese Patent Application No. 2010-162861.

* cited by examiner

GROUP III NITRIDE SEMICONDUCTOR LIGHT EMITTING DEVICE AND PRODUCTION METHOD THEREOF, AND LAMP

TECHNICAL FIELD

The present invention relates to a group III nitride semiconductor light emitting device and a production method thereof, which are suitably used for a light emitting diode (LED), a laser diode, an electronic device, or the like, and represented by a general formula $Al_aGa_bIn_cN$ ($0 \leq a \leq 1$, $0 \leq b \leq 1$, $0 \leq c \leq 1$, $a+b+c=1$), and also relates to a lamp.

Priority is claimed on Japanese Patent Application No. 2007-176099, filed Jul. 4, 2007, the content of which is incorporated herein by reference.

BACKGROUND ART

A group III nitride semiconductor has a direct transition type band gap of energy that corresponds to a region ranging from the visible light to ultraviolet light, and also exhibits excellent light emission efficiency. For this reason, it is manufactured as a semiconductor light emitting device such as a light emitting diode (LED) and a laser diode (LD) and used in various applications. In addition, the group III nitride semiconductor also has a potential of achieving excellent characteristics when used in electronic devices, as compared to the case where a conventional group III-V compound semiconductor is used.

Conventionally, a single crystal wafer of the group III nitride semiconductor has not been commercially available, and as a method for obtaining group III nitride semiconductors, a commonly used method grows crystals thereof on a single crystal wafer made of different materials. There is a great lattice mismatch between such a substrate made of different materials and the crystals of the group III nitride semiconductor epitaxially grown thereon. For example, when gallium nitride (GaN) is grown on a sapphire ($Al_2O_3$) substrate, there is a lattice mismatch of 16% between the two. When gallium nitride is grown on an SiC substrate, there is a lattice mismatch of 6%. In general, when there is a great lattice mismatch as in the above case, it will be difficult to directly grow crystals epitaxially on a substrate, and even when the crystals are grown, crystals with a favorable level of crystallinity cannot be attained, which is a problem.

Accordingly, when epitaxially growing the crystals of the group III nitride semiconductor on a sapphire single crystal substrate or an SiC single crystal substrate by a metal organic chemical vapor deposition (MOCVD) method, a method has been proposed and has been commonly conducted, in which a layer called a low temperature buffer layer composed of aluminum nitride (AlN) or aluminum gallium nitride (AlGaN) is first laminated on the substrate, and the crystals of the group III nitride semiconductor having a high temperature are epitaxially grown thereon (for example, refer to Patent Documents 1 and 2).

However, in the method described in Patent Documents 1 and 2, since there is basically no lattice matching between the substrate and the crystals of the group III nitride semiconductor grown thereon, a dislocation known as threading dislocation which extends towards the surface is included inside the grown crystals. For this reason, distortions of crystals occur, as a result of which sufficient intensity of light emission cannot be achieved without the optimization of crystal structure, and the problems such as the decline in the productivity also arise.

In addition, regarding the method in which an intermediate layer (buffer layer) composed of AlN or the like is formed on top of a substrate using a method other than an MOCVD method, followed by the formation of a layer thereon by an MOCVD method, for example, a method has been proposed in which, on top of the intermediate layer formed by a high-frequency sputtering process, a crystal having the same composition is grown by an MOCVD method (for example, refer to Patent Document 3). However, with the method disclosed in Patent Document 3, there is a problem in that crystals cannot be laminated reliably on a substrate in a favorable manner.

Accordingly, in order to reliably obtain satisfactory crystals, a method in which an intermediate layer was grown, followed by the annealing thereof in a mixed gas composed of ammonia and hydrogen (for example, refer to Patent Document 4), a method in which a buffer layer is formed at a temperature of 400° C. or higher by a DC sputtering process (for example, refer to Patent Document 5), or the like has been proposed. In addition, in Patent Documents 4 and 5, as a material used for a substrate, sapphire, silicon, silicon carbide, zinc oxide, gallium phosphide, gallium arsenide, magnesium oxide, manganese oxide, single crystals of a group III nitride based compound semiconductor, or the like, has been mentioned, and it has been disclosed that a sapphire a-plane substrate is particularly suitable among them.

On the other hand, a method is disclosed in which a reverse sputtering process using Ar gas is conducted as a pretreatment for a semiconductor layer when forming an electrode on the semiconductor layer (for example, refer to Patent Document 6). According to the method disclosed in Patent Document 6, by conducting a reverse sputtering process on the surface of a group III nitride compound semiconductor layer, characteristics in terms of electrical contact between the semiconductor layer and the electrode can be improved.

However, because all these methods described above are methods in which an intermediate layer is laminated on a substrate without being modified and a group III nitride compound semiconductor is then epitaxially grown thereon, there is a lattice mismatch between the substrate and the crystals of the group III nitride semiconductor, and thus satisfactory crystals cannot be obtained reliably, which has been a problem.

[Patent Document 1] Japanese Patent Publication No. 3026087
[Patent Document 2] Japanese Unexamined Patent Application, First Publication No. Hei 4-297023
[Patent Document 3] Japanese Examined Patent Application, Second Publication No. Hei 5-86646
[Patent Document 4] Japanese Patent Publication No. 3440873
[Patent Document 5] Japanese Patent Publication No. 3700492
[Patent Document 6] Japanese Unexamined Patent Application, First Publication No. Hei 8-264478

DISCLOSURE OF INVENTION

When growing an intermediate layer on the surface of a substrate, if the substrate surface was not cleaned, it is difficult to grow the intermediate layer as a crystal perpendicular to the substrate. For this reason, when growing an intermediate layer on a substrate, it is necessary to remove the impurities or the like on the substrate surface in advance. Therefore, for example, it is possible to remove the impurities or the like from the substrate surface in advance by adopting the above-mentioned method disclosed in Patent Document 6 that uses a reverse sputtering process for pretreating the substrate.

However, when the impurities or the like on the substrate are removed by adopting the reverse sputtering process as described earlier, if an excess power is applied to the substrate, there is a possibility that the substrate surface is damaged and the expected effects due to the removal of impurities are not attained. In such a case, the intermediate layer grown on the substrate is not orientated and the lattice matching between the substrate and a semiconductor layer is not achieved. Accordingly, a problem arises in that a semiconductor layer with a favorable level of crystallinity cannot be formed on the substrate.

Orientation properties of the semiconductor layer grown on the substrate via an intermediate layer depend on the orientation properties of the intermediate layer. For this reason, when the intermediate layer formed on the substrate is not orientated, the semiconductor layer laminated thereon is also not orientated. Therefore, when a less amount of orientating components is present in the substrate surface, the level of crystallinity of the semiconductor layer becomes low, which leads to a problem of decline in the light emitting properties of a group III nitride semiconductor light emitting device.

In order to solve the problems as mentioned above when subjecting the substrate to a reverse sputtering process, it is necessary to set the conditions for the reverse sputtering process so that the impurities or the like are removed without damaging the substrate surface. However, the respective conditions, such as the extent of actual power applied to the substrate, differ greatly depending on the manufacturing apparatus (a chamber) used for the reverse sputtering process, and thus the conditions for the reverse sputtering process need to be changed for each apparatus, which requires time and effort to control the conditions in the manufacturing processes.

On the other hand, as one of the conventionally available methods for evaluating the orientation properties of crystals, there is a rocking curve method using X-ray, and the method is also commonly used as an indicator for optimally controlling the orientations of the intermediate layer and the group III nitride semiconductor formed on the intermediate layer, even in the group III nitride semiconductor light emitting device as described above. However, as shown in the graph of FIG. 9, there is no correlation between the full width at half maximum in X-ray rocking curve of a (0002) plane of the intermediate layer and the full width at half maximum in X-ray rocking curve of a (0002) plane of a base layer, which is formed on this intermediate layer and is composed of a group III nitride semiconductor. For this reason, even when the orientation of intermediate layer was controlled using the full width at half maximum in X-ray rocking curve of a (0002) plane of the intermediate layer, the crystallinity of a base layer (i.e., a GaN layer) formed thereon does not necessarily achieve a favorable level.

Here, for example, if it was only for the portion composed of orientating components in the crystal organization of the intermediate layer, the orientation properties can be evaluated and thus can be controlled using the full width at half maximum in X-ray rocking curve. However, as a result of intensive and extensive studies conducted by the present inventors, regarding the portion composed of non-orientating broad components within the crystal organization of the intermediate layer, the orientation properties cannot be evaluated using the full width at half maximum in X-ray rocking curve, and thus, as described earlier, it is thought that the full width at half maximum in X-ray rocking curves between the intermediate layer and the base layer do not correlate.

Because of the problems as described above, in order to improve the crystallinity of a group III nitride semiconductor formed on the intermediate layer by making the crystal organization of the intermediate layer that is formed on the substrate to be orientated in a favorable manner, there has been a serious demand for standardizing the conditions for the reverse sputtering process so as to adequately set the conditions for each apparatus, even when the reverse sputtering process is employed for cleaning the substrate surface and a plurality of different manufacturing apparatuses are used.

The present invention is made in view of the above circumstances and its object is to provide a group III nitride semiconductor light emitting device which is constituted of a substrate, an intermediate layer formed thereon having a favorable level of orientation properties, and a group III nitride semiconductor formed thereon having a favorable level of crystallinity, and having excellent levels of light emitting properties and productivity; a production method thereof; and a lamp using the group III nitride semiconductor light emitting device.

In order to solve the above-mentioned problems, the present inventors undertook extensive and intensive research, investigating the relationships between the substrate and the intermediate layer and between the intermediate layer and the group III nitride semiconductor, regarding the orientation properties and crystal organizations therein.

As a result, by subjecting the substrate to a pretreatment by a reverse sputtering process in adequate conditions and removing impurities or the like from the substrate surface prior to the deposition of the intermediate layer using a sputtering process, the orientation properties of the intermediate layer can be controlled adequately, and also a group III nitride semiconductor crystal grown thereon can be attained as a stable and satisfactory crystal. In addition, the present inventors discovered that within the crystal organization of the intermediate layer grown on the substrate, by setting the proportion of the broad component, which is a non-orientating component, at a constant level or less, and using this proportion of the broad component as an indicator, the conditions for the reverse sputtering process can be controlled adequately depending on the manufacturing apparatus.

FIG. 7 is a graph showing the relationship between the proportion (percentage) of the non-orientating broad component within the crystal organization of the intermediate layer formed on the substrate surface, which constitutes a group III nitride semiconductor light emitting device, and the full width at half maximum in rocking curve of a (0002) plane of a base layer, which is formed on this intermediate layer and is composed of a group III nitride semiconductor. As shown in the graph of FIG. 7, it became apparent that the proportion of non-orientating broad component within the crystal organization of the intermediate layer and the full width at half maximum in rocking curve of a (0002) plane of a base layer formed on the intermediate layer were correlated.

As a result, the present inventors discovered that within the intermediate layer formed on the substrate, by setting the proportion of the broad component, which is a non-orientating component, at a constant level or less, the group III nitride semiconductor formed on the intermediate layer is orientated in a favorable manner. Moreover, the present inventors discovered that by using the above-mentioned proportion of the broad component as an indicator, the conditions for the reverse sputtering process can be controlled and set adequately depending on the manufacturing apparatus, thereby completing the present invention.

That is, the present invention relates to the following aspects.

[1] A group III nitride semiconductor light emitting device which is a group III nitride semiconductor light emitting device, in which at least an intermediate layer composed of a group III nitride compound is laminated on a substrate and an n-type semiconductor layer having a base layer, a light emitting layer and a p-type semiconductor layer are sequentially laminated on the intermediate layer, the group III nitride semiconductor light emitting device characterized in that, when components are separated, based on a peak separation technique using the X-ray rocking curve of the intermediate layer, into a broad component having the full width at half maximum of 720 arcsec or more and a narrow component, a non-orientating component that corresponds to the broad component is included in the crystal organization of the intermediate layer, and the proportion of the non-orientating component within the crystal organization of the intermediate layer is 30% or less in terms of area ratio of the intermediate layer.

[2] The group III nitride semiconductor light emitting device according to the above aspect [1], characterized in that the full width at half maximum in X-ray rocking curve of a (0002) plane in the base layer, which is laminated on the intermediate layer, is 50 arcsec or less.

[3] The group III nitride semiconductor light emitting device according to the above aspect [1] or [2], characterized in that the substrate is a sapphire substrate.

[4] The group III nitride semiconductor light emitting device according to the above aspect [3], characterized in that the intermediate layer is formed on a c-plane of the sapphire substrate.

[5] The group III nitride semiconductor light emitting device according to any one of the above aspects [1] to [4], characterized in that the film thickness of the intermediate layer is within a range from 20 to 40 nm.

[6] The group III nitride semiconductor light emitting device according to any one of the above aspects [1] to [5], characterized in that the intermediate layer has a composition including Al.

[7] The group III nitride semiconductor light emitting device according to the above aspect [6], characterized in that the intermediate layer is constituted of AlN.

[8] The group III nitride semiconductor light emitting device according to any one of the above aspects [1] to [7], characterized in that the base layer is constituted of a GaN-based compound semiconductor.

[9] The group III nitride semiconductor light emitting device according to the above aspect [8], characterized in that the base layer is constituted of $Al_xGa_{1-x}N$ ($0 \leq x \leq 1$).

[10] A method for manufacturing a group III nitride semiconductor light emitting device which is a method for manufacturing a group III nitride semiconductor light emitting device, in which at least an intermediate layer composed of a group III nitride compound is laminated on a substrate and an n-type semiconductor layer having a base layer, a light emitting layer and a p-type semiconductor layer are sequentially laminated on the intermediate layer, the method characterized by including a pretreatment step in which the substrate is subjected to a plasma treatment, and a sputtering step following the pretreatment step in which the intermediate layer is formed on the substrate using a sputtering process, wherein when components are separated, based on a peak separation technique using the X-ray rocking curve of the intermediate layer, into a broad component that corresponds to a non-orientating component included in the crystal organization of the intermediate layer and having the full width at half maximum of 720 arcsec or more and a narrow component, the sputtering step forms the intermediate layer so that the proportion of the non-orientating component within the crystal organization of the intermediate layer is 30% or less in terms of area ratio of the intermediate layer.

[11] The method for manufacturing a group III nitride semiconductor light emitting device according to the above aspect [10], characterized in that the pretreatment step is carried out by circulating a nitrogen-containing gas inside a chamber.

[12] The method for manufacturing a group III nitride semiconductor light emitting device according to the above aspect [11], characterized in that the ratio of nitrogen gas within the nitrogen-containing gas circulated inside a chamber in the pretreatment step is 50% or more.

[13] The method for manufacturing a group III nitride semiconductor light emitting device according to any one of the above aspects [10] to [12], characterized in that the pretreatment step is carried out by setting the pressure inside a chamber at 1 Pa or more.

[14] The method for manufacturing a group III nitride semiconductor light emitting device according to any one of the above aspects [10] to [13], characterized in that the pretreatment step is carried out by setting the treating time to 30 seconds or less.

[15] The method for manufacturing a group III nitride semiconductor light emitting device according to any one of the above aspects [10] to [14], characterized in that the pretreatment step is carried out by setting the temperature of the substrate within a range from 25 to 1,000° C.

[16] The method for manufacturing a group III nitride semiconductor light emitting device according to any one of the above aspects [10] to [15], characterized in that the pretreatment step and the sputtering step are carried out in the same chamber.

[17] The method for manufacturing a group III nitride semiconductor light emitting device according to any one of the above aspects [10] to [16], characterized in that the plasma treatment in the pretreatment step is a reverse sputtering process.

[18] The method for manufacturing a group III nitride semiconductor light emitting device according to the above aspect [17], characterized in that in the pretreatment step, a reverse sputtering process is carried out by generating a plasma through a power source using a high frequency.

[19] The method for manufacturing a group III nitride semiconductor light emitting device according to the above aspect [18], characterized in that the pretreatment step includes carrying out of a reverse sputtering process by generating a nitrogen plasma through a power source using a high frequency.

[20] The method for manufacturing a group III nitride semiconductor light emitting device according to the above aspect [18] or [19], characterized in that in the pretreatment step, a reverse sputtering process is carried out by applying a high frequency power of 0.1 kW or less to the substrate.

[21] The method for manufacturing a group III nitride semiconductor light emitting device according to any one of the above aspects [10] to [20], characterized in that in the sputtering step, the intermediate layer is formed so as to cover at least 90% of the surface of the substrate.

[22] The method for manufacturing a group III nitride semiconductor light emitting device according to any one of the above aspects [10] to [21], characterized in that in the sputtering step, a source material containing a group V element is used.

[23] The method for manufacturing a group III nitride semiconductor light emitting device according to any one of the above aspects [10] to [22], characterized in that in the sputtering step, the intermediate layer is formed by a reactive sputtering process in which a source material containing a group V element is circulated inside a reactor.

[24] The method for manufacturing a group III nitride semiconductor light emitting device according to the above aspect [22] or [23], characterized in that the group V element is nitrogen.

[25] The method for manufacturing a group III nitride semiconductor light emitting device according to the above aspect [22] or [23], characterized in that ammonia is used as a source material containing a group V element.

[26] The method for manufacturing a group III nitride semiconductor light emitting device according to any one of the above aspects [10] to [25], characterized in that in the sputtering step, the intermediate layer is formed by a radio-frequency (RF) sputtering process.

[27] The method for manufacturing a group III nitride semiconductor light emitting device according to the above aspect [26], characterized in that in the sputtering step, the intermediate layer is formed using an RF sputtering process while moving a magnet of a cathode.

[28] The method for manufacturing a group III nitride semiconductor light emitting device according to any one of the above aspects [10] to [27], characterized in that in the sputtering step, the intermediate layer is formed by setting the temperature of the substrate within a range from 400 to 800° C.

[29] The method for manufacturing a group III nitride semiconductor light emitting device according to any one of the above aspects [10] to [28], characterized in that the base layer is formed on the intermediate layer by a metal organic chemical vapor deposition (MOCVD) method.

[30] The method for manufacturing a group III nitride semiconductor light emitting device according to any one of the above aspects [10] to [28], characterized in that the base layer is formed on the intermediate layer by a reactive sputtering process.

[31] The method for manufacturing a group III nitride semiconductor light emitting device according to any one of the above aspects [10] to [30], characterized in that the base layer is formed by setting the temperature of the substrate within a range from 300 to 1,200° C.

[32] A group III nitride semiconductor light emitting device obtained by the manufacturing method according to any one of the above aspects [10] to [31].

[33] A lamp formed by using the group III nitride semiconductor light emitting device according to any one of the above aspects [1] to [9] and [32].

According to the group III nitride semiconductor light emitting device of the present invention, when components are separated, based on a peak separation technique using the X-ray rocking curve of the intermediate layer, into a broad component having the full width at half maximum of 720 arcsec or more and a narrow component, by including a non-orientating component that corresponds to the broad component in the crystal organization of the intermediate layer and by setting the proportion of such non-orientating component to 30% or less in terms of area ratio of the intermediate layer, the intermediate layer is formed as a layer having a highly uniform crystal organization and a favorable level of orientation properties. As a result, the lattice mismatch between the substrate and the group III nitride semiconductor grown on the intermediate layer does not occur, and thus uniformity of the group III nitride semiconductor is enhanced even further and a favorable level of orientation properties thereof is achieved. Therefore, a group III nitride semiconductor light emitting device which has excellent light emitting properties can be obtained.

In addition, according to the method of the present invention for manufacturing a group III nitride semiconductor light emitting device, because the method includes a pretreatment step in which the substrate is subjected to a plasma treatment and a sputtering step, following the pretreatment step, in which the intermediate layer is formed on the substrate using a sputtering process, and when components are separated, based on a peak separation technique using the X-ray rocking curve of the intermediate layer, into a broad component that corresponds to a non-orientating component included in the crystal organization of the intermediate layer and having the full width at half maximum of 720 arcsec or more and a narrow component, the sputtering step forms the intermediate layer so that the proportion of the non-orientating component within the crystal organization of the intermediate layer is 30% or less in terms of area ratio of the intermediate layer, the impurities or the like on the substrate are reliably removed, and the intermediate layer having a highly uniform crystal organization and a favorable level of orientation properties can be grown. As a result, the lattice mismatch between the substrate and the group III nitride semiconductor grown on the intermediate layer does not occur, and thus a group III nitride semiconductor which is orientated in a favorable manner can be formed.

In addition, because the method specifies each condition in the pretreatment step and controls the orientation properties of the intermediate layer and the crystallinity of the base layer by using the proportion of the broad component within the crystal organization of the intermediate layer as an indicator, it becomes possible to accurately set the respective manufacturing conditions without being dependent on the performance of the sputtering apparatus used.

Therefore, it becomes possible to manufacture a group III nitride semiconductor light emitting device having excellent light emitting properties at a high production efficiency.

In addition, because the lamp of the present invention is constituted using the group III nitride semiconductor light emitting device of the present invention or the group III nitride semiconductor light emitting device obtained by the manufacturing method of the present invention, excellent light emitting properties can be attained.

BEST MODE FOR CARRYING OUT THE INVENTION

Figure 1:
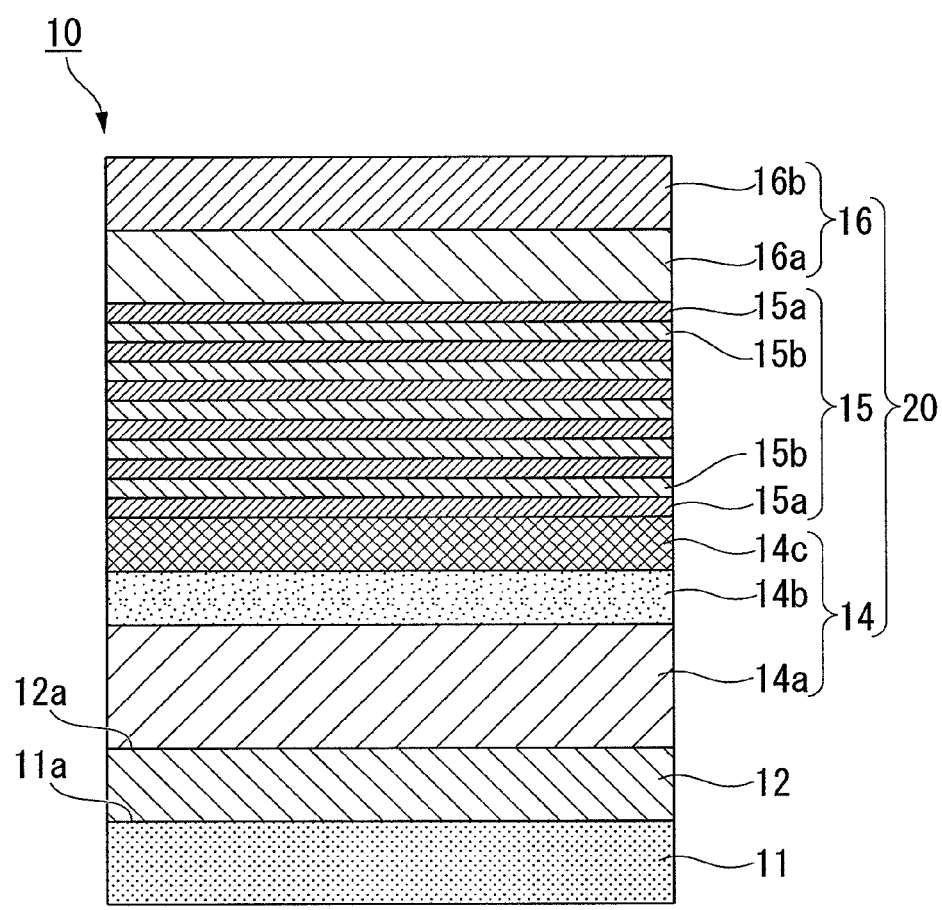
FIG. 1 is a diagram schematically describing one example of a group III nitride semiconductor light emitting device according to the present invention, and it is a schematic diagram showing a cross sectional structure of a laminated semiconductor.

One embodiment of the group III nitride semiconductor and the manufacturing method thereof, as well as the lamp using the group III nitride semiconductor according to the present invention will be described below while referring to FIGS. 1 to 8 (and also FIG. 9) where appropriate.

[Group III Nitride Semiconductor Light Emitting Device]

A group III nitride semiconductor light emitting device 1 in the present embodiment (hereafter, sometimes simply abbreviated as a light emitting device) is configured as follows (refer to FIG. 1 and FIG. 2): at least an intermediate layer 12 composed of a group III nitride compound is laminated on a substrate 11 and an n-type semiconductor layer 14 having a base layer 14*a*, a light emitting layer 15 and a p-type semiconductor layer 16 are sequentially laminated on the intermediate layer 12. When components are separated, based on a peak separation technique using the X-ray rocking curve of the intermediate layer 12, into a broad component having the full width at half maximum of 720 arcsec or more and a narrow component, a non-orientating component that corresponds to the broad component is included in the crystal organization of the intermediate layer 12, and the proportion of the broad component (non-orientating component: refer to 12*c* depicted in FIG. 6) within the crystal organization of the intermediate layer 12 is 30% or less in terms of area ratio of the intermediate layer 12.

<Laminated Structure of the Light Emitting Device>

FIG. 1 is a schematic diagram for describing one example of a group III nitride semiconductor light emitting device according to the present invention in great detail, and it is a cross sectional diagram showing one example of a laminated semiconductor in which a group III nitride semiconductor is formed on a substrate. In the laminated semiconductor 10 shown in FIG. 1, the intermediate layer 12 composed of a group III nitride compound is laminated on the substrate 11, and on the intermediate layer 12, a semiconductor layer 20 is formed which is constituted by the sequential lamination of the n-type semiconductor layer 14, the light emitting layer 15, and the p-type semiconductor layer 16.

Figure 2:
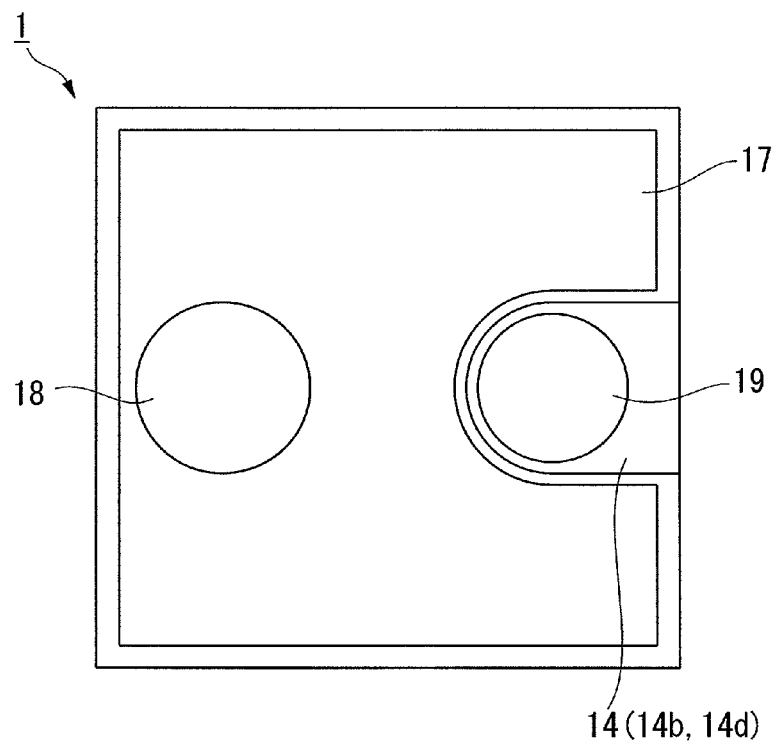
FIG. 2 is a diagram schematically describing one example of a group III nitride semiconductor light emitting device according to the present invention, and it is a schematic diagram showing a planar structure thereof.
Figure 3:
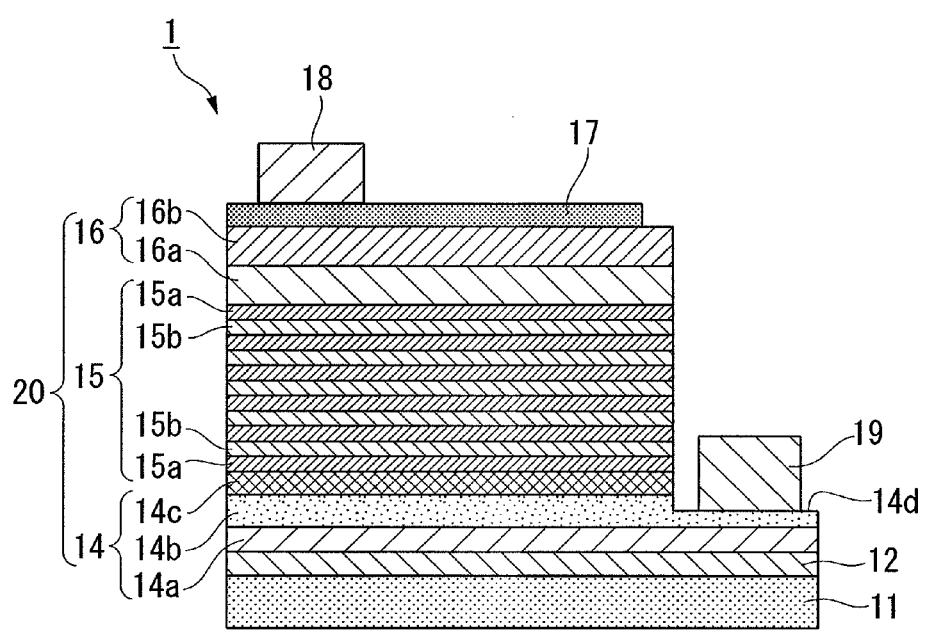
FIG. 3 is a diagram schematically describing one example of a group III nitride semiconductor light emitting device according to the present invention, and it is a schematic diagram showing a cross sectional structure thereof.

In addition, FIG. 2 and FIG. 3 are schematic diagrams showing an example in which the light emitting device 1 is configured using the laminated semiconductor 10 shown in FIG. 1, and FIG. 2 shows a plan view whereas FIG. 3 shows a cross sectional view. In the light emitting device 1 of the present embodiment, a translucent positive electrode 17 is laminated on the p-type semiconductor layer 16 of the laminated semiconductor 10, and a positive electrode bonding pad 18 is further formed thereon, while a negative electrode 19 is laminated on an exposed area 14*d* that is formed in an n-type contact layer 14*b* of the n-type semiconductor layer 14.

In addition, the intermediate layer 12 in the present embodiment is configured, as described earlier, so that the proportion of the broad component within the crystal organization thereof is 30% or less in terms of the area ratio in the surface 12*a* thereof.

The laminate structure of the group III nitride semiconductor light emitting device according to the present embodiment will be described below in more detail.

[Substrate]

In the present embodiment, there are no particular limitations on the material used for the substrate 11, provided group III nitride semiconductor crystals are able to undergo epitaxial growth on the surface of the substrate material, and any of a variety of materials may be selected for use. Specific examples of the substrate material include sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten and molybdenum. Among these materials, it is preferable to use a material having a hexagonal crystal structure, such as sapphire and SiC, from the view point that a group III nitride semiconductor with a favorable level of crystallinity can be laminated.

In addition, in terms of the size of the substrate, a substrate having a diameter of about 2 inches is commonly used. However, in the group III nitride semiconductor of the present invention, it is also possible to use a substrate having a diameter of 4 to 6 inches.

Note that it is preferable to subject the surface 11a of the substrate 11 to a cleaning treatment in advance and remove the impurities or the like thereon before growing the intermediate layer 12, and it is particularly desirable to conduct a cleaning treatment through a plasma treatment in the pretreatment step provided in the manufacturing method of the present invention, which will be described later in greater detail.

By removing the impurities or the like from the surface 11a of the substrate 11 in advance, the intermediate layer 12 grown thereon will become a layer having a highly uniform crystal organization and a favorable level of orientation properties.

In addition, when an oxide substrate, a metal substrate, or the like that is known to cause a chemical modification upon contact with ammonia at high temperatures is used among the above substrate materials, by forming an intermediate layer without the use of ammonia while forming a base layer that constitutes an n-type semiconductor layer described later with a method employing ammonia, the intermediate layer of the present embodiment operates as a coating layer, and thus it is effective in preventing the chemical modification of the substrate. Moreover, since it is generally possible to suppress the substrate temperature to a low level in the sputtering process, even when a substrate composed of a material that breaks down at high temperatures is used, each of the layers can be formed on the substrate 11 without damaging the substrate.

[Intermediate Layer]

In the laminated semiconductor 10 of the present embodiment, a metallic source material and a gas containing a group V element are activated by plasma and thus reacted, thereby forming the intermediate layer 12 on the substrate 11. A film formed by the method employing a metallic source that is made into plasma, like the layer formed in the present embodiment, has an effect in that a favorable orientation can be readily attained.

Crystals of such group III nitride compound which constitutes the intermediate layer have a hexagonal crystal structure, and a film having a single crystal structure can be obtained by controlling the film-forming conditions.

[Crystal Organization]

It is preferable from the viewpoint of a buffering function that the intermediate layer 12 have a single crystal structure. Crystals of group III nitride semiconductor have a hexagonal crystal structure and form an organization having a hexagonal column as a basic shape. Regarding the crystals of group III nitride semiconductor, by controlling the conditions for forming plasma at the time of film formation, it is possible to deposit grown crystals also in the in-plane direction. When this type of intermediate layer 12 having a single crystal structure is formed on the substrate 11, the buffering function of the intermediate layer 12 is particularly effective, and as a result, the group III nitride semiconductor formed on top of the intermediate layer 12 becomes a crystalline film having excellent orientation and crystallinity.

(Broad Component)

In the intermediate layer 12 of the present embodiment, it is configured so that the proportion of the broad component within the crystal organization thereof is 30% or less in terms of the area ratio in the surface 12a thereof. Here, the broad component described in the present invention refers to a component that corresponds to a non-orientating component within the crystal organization, although a detailed description therefor will be given later.

Figure 6:
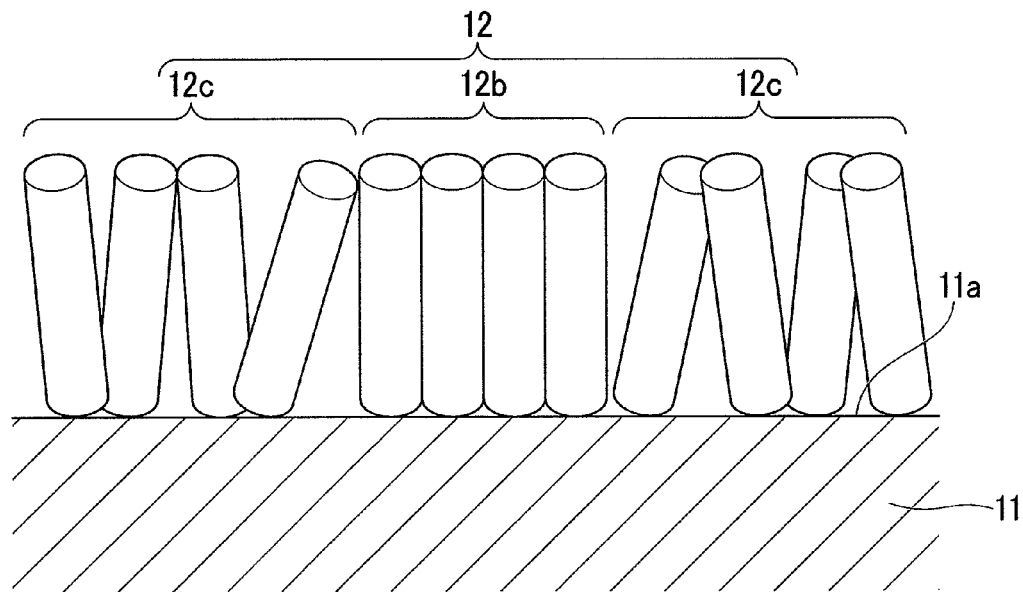
FIG. 6 is a diagram schematically describing one example of a group III nitride semiconductor light emitting device according to the present invention, and it is a diagram showing the orientation properties of a crystal structure in an intermediate layer.
Figure 7:
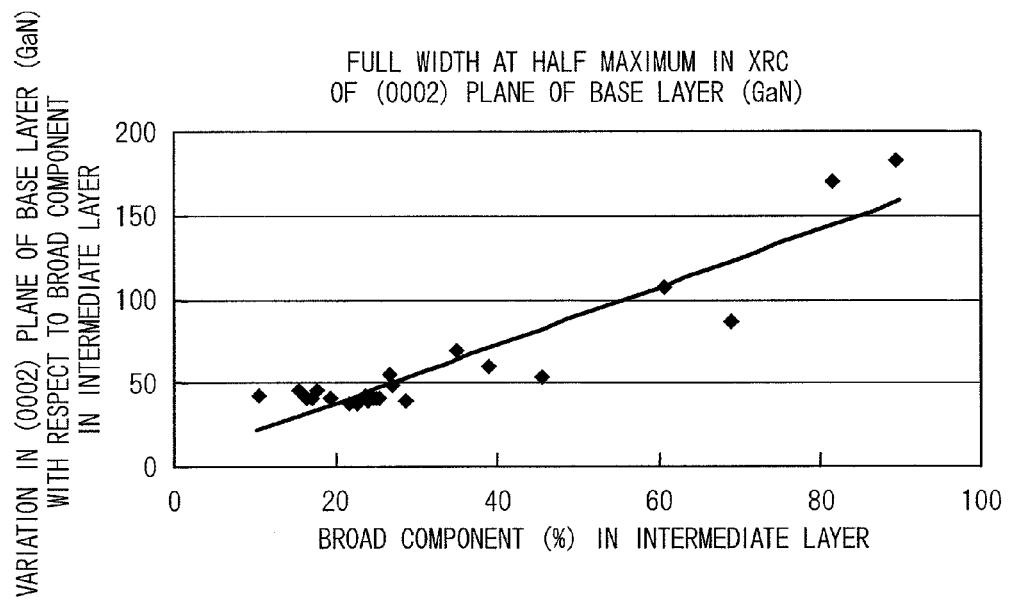
FIG. 7 is a diagram schematically describing one example of a group III nitride semiconductor light emitting device according to the present invention, and it is a graph showing the variation in the full width at half maximum in X-ray rocking curve of a (0002) plane of a base layer with respect to the proportion of the broad component within the intermediate layer.

Like the intermediate layer 12 of the present embodiment, in a film having a crystal structure formed of an assembly of hexagonal columns, as shown in the schematic diagram of FIG. 6, there are a narrow component (orientating component) 12b in a region where crystals are orientated perpendicular to the substrate 11, and a broad component (non-orientating component) 12c in a region where crystals are not perpendicular to the substrate 11 and are generally not orientated.

As mentioned earlier, orientation properties of the base layer 14a formed on top of the intermediate layer 12 and the semiconductor layer 20 depend on the orientation properties of the intermediate layer 12. For this reason, the more favorable the intermediate layer 12 is orientated, in other words, the lower the proportion of the broad component 12c in the intermediate layer 12 as compared to the orientating component 12b, the more favorable the base layer 14a is orientated. As a result, since the crystallinity of the respective layers formed on the base layer 14a; i.e., the n-type contact layer 14b, the n-type cladding layer 14c, the light emitting layer 15 and the p-type semiconductor layer 16, improves, the light emitting device 1 having excellent light emitting properties can be configured.

(Method for Analyzing Broad Component)

One example of a method for measuring and analyzing the broad component 12c within the crystal organization of the intermediate layer 12 is described below.

First, the X-ray rocking curve (XRC) for the crystal organization of the intermediate layer 12 is measured using a CuKα X-ray beam generation source as the X-ray source, and also the incident light, in which the angle of divergence thereof was made 0.01° by the use of a parabolic mirror and two crystals. Then, using the obtained data on the X-ray rocking curve, a peak separation analysis is carried out by the use of a common data analysis software. In the present embodiment, an example using "Peak Fit (registered trademark), manufactured by SeaSolve Software, Inc." as a data analysis software is described by referring to FIGS. 8A to 8D and also referring to "Peak Fit (registered trademark) Users Manual, published by SeaSolve Software, Inc.", where appropriate (in particular, refer to FIGS. 1-1 to 1-3, 1-14 to 1-16, 2-1 to 2-7, 6-7 to 6-9 and 7-11 in the aforementioned user's manual).

Figure 8A:
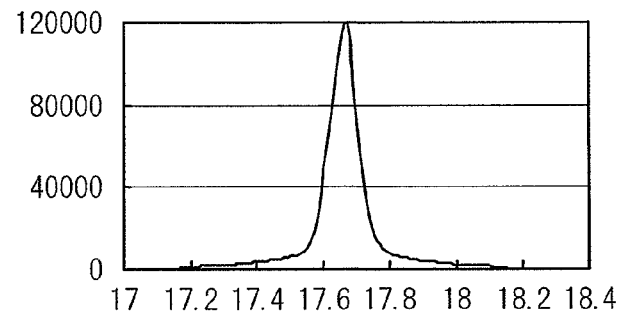
FIG. 8A is a diagram schematically describing one example of a group III nitride semiconductor light emitting device according to the present invention, and it is a waveform showing the X-ray rocking curve of the intermediate layer before being subjected to a peak separation process, and the peak herein contains a small amount of broad components.
Figure 8B:
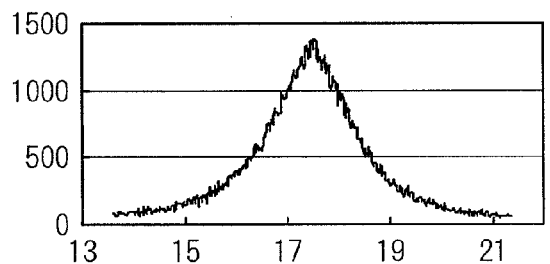
FIG. 8B is a diagram schematically describing one example of a group III nitride semiconductor light emitting device according to the present invention, and it is a waveform showing the X-ray rocking curve of the intermediate layer before being subjected to a peak separation process, and the peak herein is formed mostly due to the broad components.
Figure 8C:
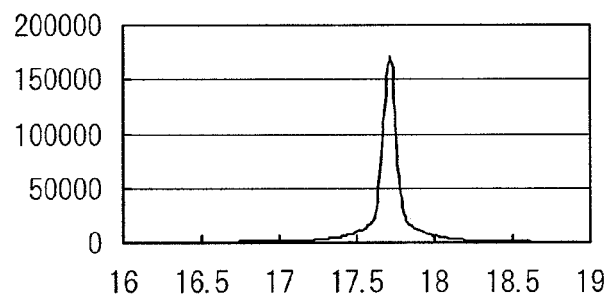
FIG. 8C is a diagram schematically describing one example of a group III nitride semiconductor light emitting device according to the present invention, and it is a waveform showing the X-ray rocking curve of the intermediate layer before being subjected to a peak separation process. Although it seems that the amount of broad components is small at a glance, the proportion of broad components is actually high since the peak width is narrow and the amount thereof is small.
Figure 8D:
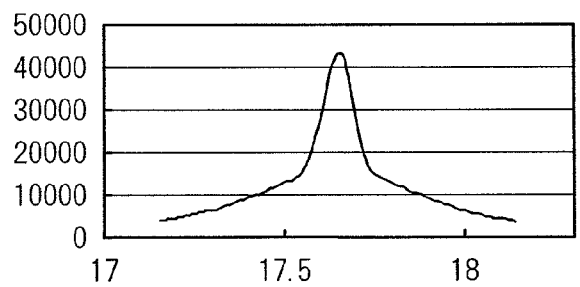
FIG. 8D is a diagram schematically describing one example of a group III nitride semiconductor light emitting device according to the present invention, and it is a waveform showing the X-ray rocking curve of the intermediate layer before being subjected to a peak separation process, and the peak herein contains a large amount of broad components.
Figure 9:
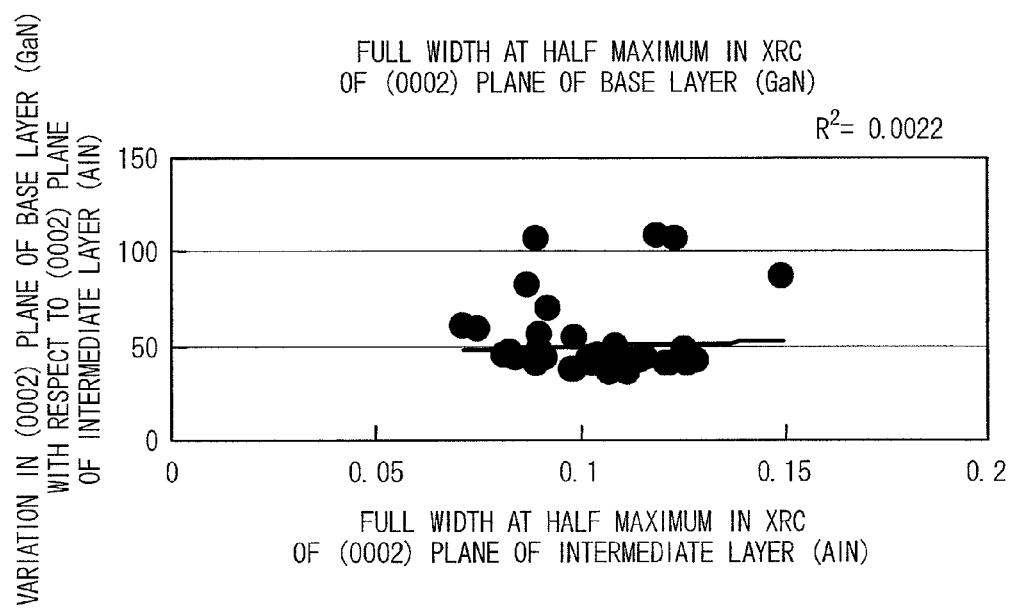
FIG. 9 is a schematic diagram for describing a conventional group III nitride semiconductor light emitting device, and it is a graph showing the relationship between the full width at half maximum in X-ray rocking curve of a (0002) plane of the intermediate layer and the full width at half maximum in X-ray rocking curve of a (0002) plane of a base layer.

Here, FIGS. 8A to 8D are waveforms showing the X-ray rocking curve for the intermediate layer 12 before being subjected to a peak separation process, and FIG. 8A shows a peak formed by containing a small amount of the broad component, FIG. 8B shows a peak formed mostly due to the broad component, FIG. 8C shows a peak in which although the amount of the broad component is small at a glance, the proportion of the broad component is actually high since the peak width is narrow and the amount thereof is small, and FIG. 8D shows a peak formed by containing a large amount of the broad component.

First, the data on the X-ray rocking curve obtained in the above described manner is read by a computer, and then "AutoFit Peaks I" which is a fitting program in the above-mentioned "Peak Fit (registered trademark)" is started.

Then, based on the above-mentioned data on the X-ray rocking curve for the intermediate layer, a waveform to be analyzed is produced using the above "AutoFit Peaks I".

Subsequently, a peak separation processing is conducted using the analysis waveform obtained by the above the above "AutoFit Peaks I", and the waveform was separated into a peak waveform composed of a broad component (non-orientating component) and a peak waveform composed of a sharp, narrow component (orientating component).

Then, after adjusting the strength and width of these broad component and orientating component, a peak fit (fitting)

processing for the peak waveform is carried out. During this process, as a fitting function, "Gaussian-Lorentzian Sum (Amplitude)" as shown in the following general formula (I) is used (refer to FIG. 7-11 in the above-mentioned user's manual).

[Eq. 1]

$$y = a_0 \left[ \frac{\frac{a_3\sqrt{ln2}}{a_2\sqrt{\pi}} \exp\left(-4ln2\left(\frac{x-a_1}{a_2}\right)^2\right) + \frac{1-a_3}{\pi a_2\left[1+4\left(\frac{x-a_1}{a_2}\right)^2\right]}}{\frac{a_3\sqrt{ln2}}{a_2\sqrt{\pi}} + \frac{1-a_3}{\pi a_2}} \right] \quad (1)$$

In the above general formula (I), a0=Amplitude (a parameter related to the peak strength), a1=center (a parameter related to the position of peak center), a2=width (>0) (a parameter related to the peak width), a3=shape (≥0, ≤1) (a parameter related to the peak shape), and Fit Time Index=2.9.

Here, the peak fit processing is carried out until no variation is observed for R2. By carrying out such a peak fit processing, a peak for the broad (non-orientating) component and a waveform to which a sharp orientating component is fitted are generated, and the area for each component in the surface 12a of the intermediate layer 12 is calculated. In addition, by calculating the proportion, in the surface 12a of the intermediate layer 12, occupied by the above-mentioned broad component, the area ratio of the broad component 12c in the crystal organization of the intermediate layer 12 can be calculated.

With respect to the intermediate layer 12 provided in the light emitting device 1 of the present embodiment, by specifying the area ratio of the broad component (non-orientating component) which can be analyzed by the above-mentioned procedures to 30% or less in the crystal organization of the intermediate layer 12, a (0002) plane which is orientated in a favorable manner can be attained. As a result, the base layer 14a formed on top of the intermediate layer 12 or the respective layers further formed thereon which are composed of group III nitride semiconductors will exhibit highly superior crystallinity.

(Full Width at Half Maximum in X-Ray Rocking Curve)

In the intermediate layer 12 of the present embodiment, the full width at half maximum in X-ray rocking curve (XRC) of the (0002) plane is preferably about 0.1 to 0.2 (i.e., 360 to 720 arcsec). When the full width at half maximum in XRC is within the above-mentioned range, it can be concluded that the intermediate layer 12 is formed of a crystal organization in which the proportion of the broad component 12c is kept low.

Here, generally speaking, even when the full width at half maximum in XRC of the intermediate layer exceeds 0.2 (720 arcsec) to some extent, if viewed independently as the full width at half maximum in XRC of an intermediate layer composed of MN, the value is not necessarily too excessive. However, the present inventors and others have discovered that the orientation properties of the base layer composed of a group III nitride semiconductor do not depend on the full width at half maximum in XRC of the intermediate layer, but depend on the above-mentioned proportion of the broad component within the intermediate layer. In the light emitting device 1 of the present invention, by specifying the proportion of the broad component within the crystal organization of the intermediate layer 12 as described earlier, the orientation properties of the base layer described layer are achieved in a favorable manner.

[Film Thickness]

The film thickness of the intermediate layer 12 is preferably within a range from 20 to 40 nm. By making the film thickness of the intermediate layer 12 within the above range, the intermediate layer 12 can be obtained which has a favorable level of crystallinity and which effectively functions as a coating layer when forming each of the layers composed of a group III nitride semiconductor on the intermediate layer 12. When the film thickness of the intermediate layer 12 is less than 20 nm, there is a possibility that the above-mentioned function of the layer as a coating layer may not be satisfactory. On the other hand, if the intermediate layer 12 is formed with a film thickness exceeding 40 nm, it is possible that its deposition process will require a long time, thereby lowering its productivity, although its function as a coating layer is not affected.

Furthermore, the intermediate layer 12 is preferably formed so as to cover at least 90% of the surface 11a of the substrate 11 in terms of the function as a coating layer.

[Composition]

As for the material constituting the intermediate layer 12, any materials can be used as long as it is a group III nitride semiconductor represented by the general formula AlGaInN. Furthermore, it may also be configured so as to include As or P as a group V element.

In addition, it is preferable that the intermediate layer 12 have a composition that includes Al, and GaAlN is particularly desirable among various possible compositions, and in this case, the composition of Al is preferably 50% or higher. Moreover, by constituting the intermediate layer 12 from AlN, it can efficiently be made as an assembly of hexagonal columns, and thus more preferable.

In addition, as a material for constituting the intermediate layer 12, any materials having the same crystal organization as that of the group III nitride semiconductor can be used. However, a material having a length of the lattice which is close to that of the group III nitride semiconductor constituting the base layer described later is preferable, and a nitride of a group IIIa element in the periodic table is particularly suitable.

[Semiconductor Layer]

As shown in FIG. 1, the laminated semiconductor 10 of the present embodiment is formed by the lamination, on the substrate 11 and via the above-mentioned intermediate layer 12, of the semiconductor layer 20 composed of a group III nitride based semiconductor and constituted of the n-type semiconductor layer 14, the light emitting layer 15, and the p-type semiconductor layer 16. In addition, in the laminated semiconductor 10 in the illustrated example, the base layer 14a provided in the n-type semiconductor layer 14 is laminated on the intermediate layer 12.

As the group III nitride semiconductors, various kinds of gallium nitride based compound semiconductors have been known which are represented by, for example, the general formula $Al_XGa_YIn_ZN_{1-A}M_A$ (0≤X≤1, 0≤Y≤1, 0≤Z≤1 and X+Y+Z=1. The letter M indicates a group V element which is different from nitrogen (N), and 0≤A<1). Also in the present invention, any kinds of the gallium nitride based compound semiconductors represented by the general formula $Al_XGa_YIn_ZN_{1-A}M_A$ (0≤X≤1, 0≤Y≤1, 0≤Z≤1 and X+Y+Z=1. The letter M indicates a group V element which is different from nitrogen (N), and 0≤A<1) including those known gallium nitride based compound semiconductors can be used without any limitations.

The gallium nitride based compound semiconductor can contain another group III element in addition to Al, Ga and In. Moreover, the gallium nitride based compound semiconductor can also contain elements such as Ge, Si, Mg, Ca, Zn, Be, P and As where necessary. Moreover, the elements contained are not limited to those added intentionally, and there are also cases where the semiconductor contain impurities that are inevitably contained depending on the film forming conditions and the like as well as the trace impurities contained in the source materials and the reaction tube materials.

[n-Type Semiconductor Layer]

The n-type semiconductor layer 14 is typically laminated on top of the aforementioned intermediate layer 12, and is composed of a base layer 14a, an n-type contact layer 14b and an n-type cladding layer 14c. Note that the n-type contact layer can also function as a base layer and/or an n-type cladding layer, whereas the base layer can also function as an n-type contact layer and an n-type cladding layer.

{Base Layer}

The base layer 14a of the present embodiment is composed of a group III nitride semiconductor and is formed by being laminated on the intermediate layer 12 through a conventionally known MOCVD method in the present embodiment.

With respect to the material for the base layer 14a, it is not necessarily the same as that for the intermediate layer formed on top of the substrate 11 and different materials may be used. However, the base layer 14a is preferably constituted from an $Al_XGa_{1-X}N$ layer ($0 \le X \le 1$, preferably $0 \le X \le 0.5$ and more preferably $0 \le X \le 0.1$).

(Full Width at Half Maximum in X-Ray Rocking Curve)

For the base layer 14a in the present embodiment, the full width at half maximum in rocking curve of the (0002) plane is preferably 50 arcsec or lower.

As mentioned earlier, as shown in the graph of FIG. 7, it has been made apparent that the proportion (percentage) of non-orientating broad component 12c within the crystal organization of the intermediate layer 12 and the full width at half maximum in rocking curve of a (0002) plane of a base layer 14a formed on top of the intermediate layer 12 are correlated. For this reason, by first reliably removing the impurities or the like from the surface 11a of the substrate 11, it becomes possible to form the intermediate layer 12 which includes a low proportion of the broad component 12c and which is orientated in a favorable manner.

In the intermediate layer 12 of the present embodiment on which the base layer 14a is laminated, it is configured so that the proportion of the broad component within the crystal organization thereof is 30% or less in terms of the area ratio in the surface 12a of the intermediate layer 12. Because the base layer 14a formed on top of the intermediate layer 12 having favorable orientation properties grows as a layer orientated in a favorable manner, the semiconductor layer 20 which grows further thereon and is constituted from the respective layers composed of group III nitride semiconductors will exhibit highly superior crystallinity.

When forming each layers composed of group III nitride semiconductors, as mentioned earlier, it is difficult to directly form a single crystal of a group III nitride semiconductor by a sputtering process, for example, on a (0001) c-plane of a substrate made of sapphire, due to the difference between the lattice constant of the substrate and that of the group III nitride semiconductor. Accordingly, in the present invention, the intermediate layer 12 is first formed on the substrate 11 which has been subjected to a pretreatment, and the base layer 14a constituted from a single crystal of a group III nitride semiconductor is then formed thereon in advance. On top of the base layer 14a formed of a single crystal, a single crystal layer of a group III nitride semiconductor which has a favorable level of crystallinity can be readily formed using a sputtering process.

(Component Composition)

As a result of intensive and extensive studies conducted by the present inventors and others, it became clear that as a material used in the base layer 14a, a group III nitride compound containing Ga, in other words, a GaN based compound semiconductor is preferable.

When the intermediate layer 12 is configured from AlN, the dislocation looping through a migration process is necessary so that the base layer 14a does not simply inherit the crystallinity of the intermediate layer 12 as it is. As a material that readily causes the dislocation looping, a GaN based compound semiconductor containing Ga may be mentioned as an example, and in particular, AlGaN or GaN can be used suitably.

(Film Thickness)

It is preferable to make the film thickness of the base layer 14a within a range from 0.1 to 8 µm from the viewpoint that a base layer with a favorable level of crystallinity can be obtained. It is more preferable to make the film thickness within a range from 0.1 to 2 µm from the viewpoint that the time required for the deposition process can be shortened which leads to an improved productivity.

(Dopant)

The base layer 14a may be doped with an n-type impurity at a concentration within a range from $1 \times 10^{17}$ to $1 \times 10^{19}/cm^3$ if required. However, the base layer 14a may be undoped $1 \times 10^{17}/cm^3$). It is preferable that the base layer 14a be undoped in view of the maintenance of a favorable level of crystallinity.

In those cases where the substrate 11 is electrically conductive, by doping the base layer 14a with a dopant to make the layer electrically conductive, electrodes can be formed on the top and bottom of the light emitting device. On the other hand, in those cases where an insulating material is used as the substrate 11, because a chip structure must be adopted in which both the positive electrode and the negative electrode are provided on the same surface of the light emitting device, forming the base layer 14a from an undoped crystal yields superior crystallinity and is consequently preferred. There are no particular limitations on the n-type impurity, and suitable examples thereof include Si, Ge and Sn, and of these, Si and Ge are preferred.

{n-Type Contact Layer}

The n-type contact layer 14b of the present embodiment is composed of a group III nitride semiconductor, and is formed by being laminated on the base layer 14a through an MOCVD method.

It is preferable that the n-type contact layer 14b be constituted from an $Al_xGa_{1-x}N$ layer ($0 \le x \le 1$, preferably $0 \le x \le 0.5$, and more preferably $0 \le x \le 0.1$) as in the case of the base layer 14a. In addition, it is preferable that the n-type contact layer 14b be doped with an n-type impurity. It is preferable that the n-type contact layer 14b contain an n-type impurity at a concentration of $1 \times 10^{17}$ to $1 \times 10^{19}/cm^3$, and more preferably $1 \times 10^{18}$ to $1 \times 10^{19}/cm^3$ from the viewpoints of the maintenance of a favorable ohmic contact with a negative electrode, the prevention of the occurrence of cracking, and the maintenance of a favorable level of crystallinity. Although n-type impurities are not particularly limited, examples thereof include Si, Ge, and Sn and Si and Ge are preferable. Preferable range of the growth temperature for the n-contact layer is the same as that of the base layer. Moreover, as described above, the n-type contact layer 14b can also be configured so as to include a base layer.

The gallium nitride-based compound semiconductors that constitute the base layer 14a and the n-type contact layer 14b are preferably of the same composition, and the combined thickness of these layers is typically set within a range from 0.1 to 20 µm, preferably from 0.5 to 15 µm, and more preferably from 1 to 12 µm. When the combined thickness is within such a range, the level of crystallinity of the semiconductor can be favorably maintained.

{n-Type Cladding Layer}

It is preferable that the n-type cladding layer 14c be provided between the above-mentioned n-type contact layer 14b and the light emitting layer 15 described later in detail. By providing the n-type cladding layer 14c, the deterioration in the flatness of the outermost surface of the n-type contact layer 14b can be alleviated. The n-type cladding layer 14c can be formed from AlGaN, GaN, GaInN, or the like through the use of a sputtering process or the like. In addition, it is also possible to configure a heterojunction of these structures or a superlattice structure where these structures are laminated several times. It goes without saying that when forming the n-cladding layer 14c with GaInN, it is desirable that its bandgap is larger than that of GaInN in the light emitting layer 15.

Although there is no particular limitation on the film thickness of the n-type cladding layer 14c, it is preferably within a range from 5 to 500 nm and more preferably within a range from 5 to 100 nm.

In addition, the n-type dopant concentration of the n-type cladding layer 14c is preferably within a range from $1 \times 10^{17}$ to $1 \times 10^{20}$/cm$^3$, and more preferably within a range from $1 \times 10^{18}$ to $1 \times 10^{19}$/cm$^3$. When the dopant concentration is within the above range, it is preferable from the viewpoints of the maintenance of satisfactory crystallinity and the reduction in the operating voltage of a light emitting device.

[p-Type Semiconductor Layer]

The p-type semiconductor layer 16 is usually composed of a p-type cladding layer 16a and a p-type contact layer 16b, and is formed through a deposition process using a reactive sputtering process. In addition, the p-type contact layer may also function as a p-type cladding layer.

The p-type semiconductor layer 16 of the present embodiment is formed by adding a p-type impurity thereto in order to control the electrical conductivity thereof to p-type electrical conductivity. There is no particular limitation on the p-type impurity. However, the use of Mg is preferable, and Zn can also be used in a similar manner.

In addition, there are no particular limitations on the film thickness of the p-type semiconductor layer 16 as a whole. However, it is preferably within a range from 0.05 to 1 µm.

{p-Type Cladding Layer}

Although there are no particular limitations on the p-type cladding layer 16a, provided it has a composition that exhibits a larger band gap energy than that of the light emitting layer 15 described layer in detail and is capable of confining a carrier in the light emitting layer 15, examples of preferred layers include those formed of Al$_d$Ga$_{1-d}$N (wherein 0<d≤0.4, and preferably 0.1≤d≤0.3). It is preferable that the p-type cladding layer 16a be composed of this type of AlGaN in terms of confining a carrier in the light emitting layer 15.

There are no particular limitations on the film thickness of the p-type cladding layer 16a. However, it is preferably within a range from 1 to 400 nm, and more preferably within a range from 5 to 100 nm.

The p-type dopant concentration within the p-type cladding layer 16a which is achieved by the addition of a p-type impurity is preferably within a range from $1 \times 10^{18}$ to $1 \times 10^{21}$/cm$^3$, and more preferably within a range from $1 \times 10^{19}$ to $1 \times 10^{20}$/cm$^3$. A p-type dopant concentration within the above-mentioned range enables a favorable p-type crystal to be obtained with no deterioration in the crystallinity.

{p-Type Contact Layer}

The p-contact layer 16b is a gallium nitride-based compound semiconductor layer containing at least Al$_e$Ga$_{1-e}$N (0≤e<0.5, preferably 0≤e≤0.2 and more preferably 0≤e≤0.1). An Al composition within the above range is preferred in terms of maintaining a favorable level of crystallinity, and achieving a favorable ohmic contact with a p-type ohmic electrode (refer to a translucent electrode 17 described later).

There are no particular limitations on the film thickness of the p-type contact layer 16b. However, the thickness of the p-type contact layer 16b is preferably within a range from 10 to 500 nm, and more preferably within a range from 50 to 200 nm. It is preferable that the film thickness be within this range from a viewpoint of light emission output.

In addition, when the p-type dopant concentration achieved by adding p-type impurities to the p-type contact layer 16b is within a range from $1 \times 10^{18}$ to $1 \times 10^{21}$/cm$^3$, it is preferable in terms of maintaining a favorable ohmic contact, preventing the occurrence of cracking, and maintaining a favorable level of crystallinity. The p-type dopant concentration is more preferably within a range from $5 \times 10^{19}$ to $5 \times 10^{20}$/cm$^3$.

[Light Emitting Layer]

The light emitting layer 15 is the layer that is laminated onto the n-type semiconductor layer 14, and onto which is then laminated the p-type semiconductor layer 16. The light emitting layer 15 can be formed by employing a known MOCVD method or the like. In addition, as shown in FIG. 1, the light emitting layer 15 is formed by the alternate and repeated lamination of a barrier layer 15a composed of a gallium nitride-based compound semiconductor, and a well layer 15b composed of a gallium nitride-based compound semiconductor containing indium. In the illustrated example, the light emitting layer 15 is formed by the lamination of the above two layers in the order so that the barrier layer 15a is disposed at both sides adjacent to the n-type semiconductor layer 14 and the p-type semiconductor layer 16.

As the barrier layer 15a, for example, a gallium nitride-based compound semiconductor such as Al$_c$Ga$_{1-c}$N (0≤c<0.3) can be used favorably which has a larger band gap energy than that of the well layer 15b composed of a gallium nitride-based compound semiconductor that contains indium.

In addition, as the well layer 15b, for example, a gallium indium nitride such as Ga$_{1-s}$In$_s$N (0<s<0.4) can be used as a gallium nitride-based compound semiconductor that contains indium.

In addition, although there are no particular limitations on the film thickness of the light emitting layer 15 as a whole, a film thickness where the quantum effect is achieved, that is, the critical film thickness is preferable. For example, the film thickness of the light emitting layer 15 is preferably within a range from 1 to 500 nm, and the film thickness of about 100 nm is more preferable. When the film thickness is within the above range, this contributes to the improvement of light emission output.

[Translucent Positive Electrode]

The translucent positive electrode 17 is an electrode having translucency that is formed on top of the p-type semiconductor layer 16 (in other words, on the p-type contact layer 16b).

There are no particular limitations on the material used for the translucent positive electrode 17, and by using materials such as ITO (In$_2$O$_3$—SnO$_2$), AZO (ZnO—Al$_2$O$_3$), IZO (In$_2$O$_3$—ZnO), and GZO (ZnO—Ga$_2$O$_3$), the translucent positive electrode 17 can be formed through a conventional means well known in this technical field. In addition, also in terms of the structure thereof, any structure may be used without any particular limitations, including any of the conventionally known structures.

Further, the translucent positive electrode 17 may be formed so as to cover almost the entire surface of the p-type semiconductor layer 16 in which Mg is doped, or may be formed in a lattice shape or tree shape with gaps therein.

[Positive Electrode Bonding Pad and Negative Electrode]

A positive electrode bonding pad 18 is an electrode formed on the above-mentioned translucent positive electrode 17.

As the material for the positive electrode bonding pad 18, various structures using Au, Al, Ni, Cu, and the like are well known, and any of these known materials or structures can be used without any limitations.

It is preferable that the thickness of the positive electrode bonding pad 18 be within a range from 100 to 1,000 nm. In addition, the bonding pad has characteristics that, as the thickness thereof increases, the bondability thereof is improved. Therefore, it is more preferable that thickness of the positive electrode bonding pad 18 be equal to or greater than 300 nm. Furthermore, it is preferable that the thickness of the positive electrode bonding pad be equal to or less than 500 nm from the viewpoint of manufacturing cost.

In the semiconductor layer in which the n-type semiconductor layer 14, the light-emitting layer 15, and the p-type semiconductor layer 16 are sequentially laminated on the substrate 11, a negative electrode 19 is formed so as to contact the n-type contact layer 14b of the n-type semiconductor layer 14.

For this reason, when forming the negative electrode 19, a portion of the p-type semiconductor layer 16, the light emitting layer 15, and the n-type semiconductor layer 14 is first removed to expose the n-type contact layer 14b and thereby forming an exposed area 14d, and the negative electrode 19 is then formed on the exposed area 14d.

As the material for the negative electrode 19, negative electrodes of various compositions and structures are already well known, and any of these known negative electrodes can be used without any particular limitations. The negative electrode 19 can be formed through a conventional means well known in this technical field.

As described so far, according to the group III nitride semiconductor light emitting device 1 of the present embodiment, because it is configured so that the proportion of the broad component, which is a non-orientating component, within the crystal organization in the intermediate layer 12 that is laminated on the substrate 11 is 30% or less, the intermediate layer 12 is formed as a layer having a highly uniform crystal organization and a favorable level of orientation properties. As a result, the lattice mismatch between the substrate 11 and the semiconductor layer 20 that is composed of a group III nitride semiconductor grown on the intermediate layer 12 does not occur, and thus uniformity of the group III nitride semiconductor is enhanced even further and a favorable level of crystallinity is achieved. Therefore, a group III nitride semiconductor light emitting device which has excellent light emitting properties can be obtained.

[Method for Manufacturing Group III Nitride Semiconductor Light Emitting Device]

A method for manufacturing a group III nitride semiconductor light emitting device 1 according to the present embodiment is a method in which at least the intermediate layer 12 composed of a group III nitride compound is laminated on the substrate 11 and then the n-type semiconductor layer 14 provided with the base layer 14, the light emitting layer 15, and the p-type semiconductor layer 16 are sequentially laminated on the intermediate layer 12. It is a method that includes a pretreatment step in which the substrate 11 is subjected to a plasma treatment, and a sputtering step following the pretreatment step in which the intermediate layer 12 is formed on top of the substrate 11 by a sputtering process, and in the sputtering step, when components are separated, based on a peak separation technique using the X-ray rocking curve of the intermediate layer 12, into a broad component (refer to 12c depicted in FIG. 6) having the full width at half maximum of 720 arcsec or more and corresponds to a non-orientating component within the crystal organization of the intermediate layer 12 and a narrow component (refer to 12b depicted in FIG. 6), the intermediate layer 12 is formed so that the proportion of the broad component within the crystal organization of the intermediate layer 12 is 30% or less in terms of the area ratio of the intermediate layer 12.

Additionally, in the manufacturing method of the present embodiment, as exemplified in the schematic diagrams shown in FIG. 2 and FIG. 3, by using the laminated semiconductor 10 (refer to FIG. 1) in which the respective layers are laminated on the substrate 11, the translucent positive electrode 17 is laminated on top of the p-type semiconductor layer 16 of the laminated semiconductor 10 and a positive electrode bonding pad 18 is formed thereon, while the negative electrode 19 is laminated on the exposed area 14d formed in the n-type contact layer 14b of the n-type semiconductor layer 14, as a result of which the light emitting device 1 is attained.

In the manufacturing method of the present embodiment, the crystals of a group III nitride semiconductor is grown epitaxially on the substrate 11, and when forming the laminated semiconductor 10 as shown in FIG. 1, the intermediate layer 12 is formed on the substrate 11, which has been subjected to a plasma treatment in the pretreatment step, by a sputtering process, followed by the formation of the semiconductor layer 20 thereon. In the present embodiment, the intermediate layer 12 is formed using a sputtering process, and then the base layer 14a of the n-type semiconductor layer 14 is formed thereon, followed by the respective formation of the n-type contact layer 14b, the n-type cladding layer 14c, the light emitting layer 15, and the p-type semiconductor layer 16 through an MOCVD method.

[Pretreatment Step (Washing of Substrate)]

First, the surface 11a of the substrate 11 is subjected to a pretreatment.

The plasma treatment carried out in the pretreatment step of the present embodiment is preferably conducted in a plasma containing a gas that generates active plasma species such as nitrogen and oxygen. Among various possibilities, nitrogen gas is particularly suitable. By treating the surface of the substrate 11 with such a plasma of nitrogen gas or the like, impurities such as the organic materials or oxides adhered to the surface 11a of the substrate 11 can be removed.

By subjecting the substrate 11 to a pretreatment as described in the present embodiment, the intermediate layer 12 can be formed in an orientated state on the entire surface 11a of the substrate 11, and it becomes possible to orientate a group III nitride semiconductor which will be formed thereon in a favorable manner.

(Reverse Sputtering Process)

In addition, the plasma treatment carried out in the pretreatment step of the present embodiment is preferably conducted through a reverse sputtering process. In the present embodiment, by conducting a reverse sputtering process which is carried out by applying voltage between the substrate 11 and a chamber 41 (refer to the sputtering apparatus 40 in FIG. 5), plasma particles efficiently act on the substrate 11.

In the pretreatment step of the present embodiment, the plasma used for the reverse sputtering process is preferably generated by radio-frequency (RF) discharge using a high-frequency power source, and is more preferably carried out by generating nitrogen plasma. By generating a plasma by RF discharge, it becomes possible to subject, even a substrate constituted of an insulator, to a pretreatment process by the plasma treatment.

(Gas for Plasma Treatment)

The gas for carrying out a plasma treatment on the substrate 11 may be composed only of one kind of a component gas or may use a mixture of several kinds of component gases. Among various possibilities, it is preferable to circulate a nitrogen-containing gas inside the chamber 41. In addition, it is preferable that the ratio of nitrogen gas within the nitrogen-containing gas be at least 50%, and it is more preferable that the ratio of nitrogen gas be 100%.

By using a nitrogen-containing gas as a gas for plasma treatment and also setting the proportion of the nitrogen gas within the nitrogen-containing gas to at least 50%, a plasma treatment can be conducted efficiently on the surface 11a of the substrate 11.

Note that when a plasma treatment is conducted through a reverse sputtering process, since no film-forming treatment is carried out on the substrate, Ar or the like is not necessarily contained in the gas used. Since inert gas such as Ar does not react with impurities or the like on the substrate, not only the effects of pretreatment are not attained but also there is a possibility that the substrate may be damaged when the Ar content is too high.

(Pressure Inside Chamber)

The pretreatment step of the present embodiment is preferably carried out by setting the pressure inside the chamber 41 at 1 Pa or higher.

In the plasma treatment through a reverse sputtering process, the pretreatment can be conducted more effectively as the gas pressure inside the chamber 41 increases. When the pressure inside the chamber 41 is less than 1 Pa, not only the effects of the pretreatment through a reverse sputtering process become difficult to achieve, but also the substrate is damaged.

(Time for Pretreatment)

It is preferable that the time for the pretreatment through a plasma treatment be 30 seconds or less. When the time for pretreatment exceeds 30 seconds, there is a possibility that the surface 11a of the substrate 11 is damaged in certain ways, for example, may be discolored.

Examples of possible factors that are causing such discoloration of substrate include the deterioration of substrate surface due to the prolonged power application thereto, and the adherence of the stainless steel member or the like, which is provided inside the chamber and is then sputtered, on the substrate surface. In addition, when the time for pretreatment exceeds 30 seconds, for example, even when the pretreatment time is about 1 minute (60 seconds) or about 5 minutes (300 seconds), the extent of such damages caused on the substrate surface will become more or less the same.

Further, when the time for pretreatment is too short, the effects due to the plasma treatment may not be attained. Accordingly, it is preferable that the time for the pretreatment in which a plasma treatment is conducted is preferably at least 1 second.

(Temperature for Pretreatment)

The temperature when conducting a plasma treatment, in other words, the treatment of the substrate 11 is preferably within a range from 25 to 1,000° C. If the temperature for pretreatment is too low, even when a plasma treatment is conducted, the effects thereof are not fully attained. On the other hand, if the temperature for pretreatment is too high, the substrate surface may be damaged. It is more preferable that the temperature for pretreatment be within a range from 300 to 800° C.

(High-Frequency Power)

In the pretreatment step of the present embodiment, it is preferable to carry out a reverse sputtering process by applying a high-frequency power of 0.1 kW (100 W) or less to the substrate 11.

When conducting a plasma treatment through a reverse sputtering process, the weaker the power applied to the substrate 11, the more effective the pretreatment conducted on the substrate 11 becomes. When the high-frequency power applied to the substrate 11 exceeds 0.1 kW, the effects of the pretreatment through a reverse sputtering process are impaired, and the proportion of the broad component in the intermediate layer formed on top of the substrate 11 increases.

Note that although there are no particular limitations on the lower limit for the high-frequency power applied to the substrate 11, because it is difficult to control the high-frequency power when the level thereof is too weak, and also due to the characteristics of the sputtering apparatus used, a high-frequency power of about 0.01 kW (10 W) is thought to be the lower limit therefor.

(Chamber Used in Pretreatment Step)

In terms of the chamber used in the pretreatment step of the present embodiment, the sputtering apparatus 40 (refer to FIG. 5) described later in greater detail which is used for forming the intermediate layer in the sputtering step described later may be used by replacing the atmospheric gas inside the chamber 41, or alternatively, another chamber may be used. When using the same apparatus as a common sputtering apparatus used in both the pretreatment step and the sputtering step, it is favorable from the viewpoints of cost reduction in terms of manufacturing facilities, reduction of the process time, and improvements in the operation rate.

(Other Treatments in the Pretreatment Step)

Additionally, it is also possible to adopt a wet method in combination for the pretreatment conducted on the substrate 11. For example, for a substrate made of silicon, by making the substrate surface hydrogen-terminated through a conventionally known RCA washing method or the like, in the sputtering step which will be described later in greater detail, the effects are attained in that the process for forming an intermediate layer on the substrate can be stabilized.

In the present embodiment, after conducting a plasma treatment on the substrate 11 in the pretreatment step, the intermediate layer 12 composed of a group III nitride compound is laminated thereon in the sputtering step described later, and then the n-type semiconductor layer 14 provided with the base layer 14a is formed on the intermediate layer 12. As a result, because the intermediate layer can be formed in a state where the surface 11a of the substrate 11 is washed, the intermediate layer 12 can be formed by being orientated in a favorable manner while suppressing the broad component within the crystal organization thereof to 30% or less, and the base layer 14a which is formed on top of the intermediate layer 12 can also be formed with favorable orientation properties. Therefore, as shown in the working examples described layer, the crystallinity of the group III nitride semiconductor greatly improves and the light emitting properties of the light emitting device are enhanced.

[Sputtering Step (Formation of Intermediate Layer)]

The sputtering step of the present embodiment is a step in which the intermediate layer 12 is formed on top of the substrate 11 using a sputtering process, and the intermediate layer 12 is formed, for example, by activating a metallic source material and a gas containing a group V element with plasma and thereby reacting them. In addition, in the sputtering step of the present embodiment, when components are separated, based on a peak separation technique using the X-ray rocking curve of the intermediate layer 12, into a broad component 12c having the full width at half maximum of 720 arcsec or more and corresponds to a non-orientating component within the crystal organization of the intermediate layer 12 and a narrow component 12b, the intermediate layer 12 is formed so that the proportion of the broad component 12c within the crystal organization of the intermediate layer 12 is 30% or less in terms of the area ratio of the intermediate layer 12.

Figure 5:
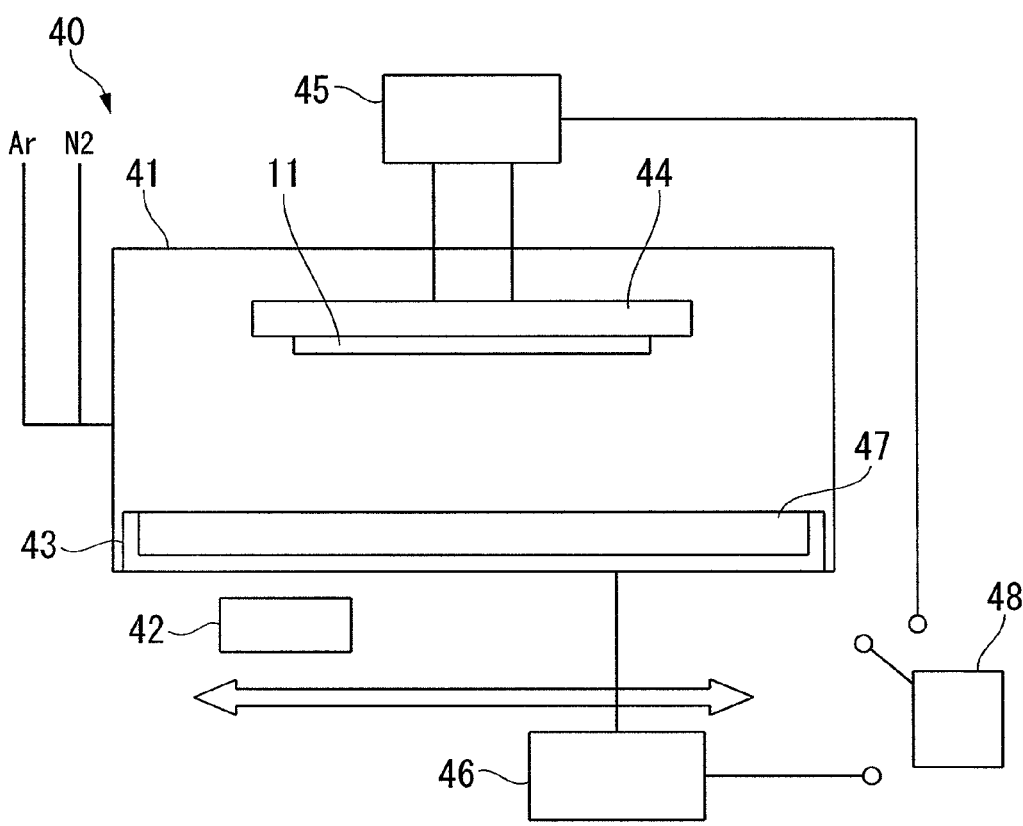
FIG. 5 is a diagram schematically describing one example of a method according to the present invention for manufacturing a group III nitride semiconductor light emitting device, and it is a schematic diagram showing a structure of a sputtering apparatus in which a target is provided inside a chamber.

In the present embodiment, after conducting a pretreatment on the surface 11a of the substrate 11 in the above-mentioned pretreatment step, argon and nitrogen gases are introduced inside the chamber 41 of the sputtering apparatus as shown in FIG. 5 and will be described later in greater detail, and the temperature of the substrate 11 is reduced down to a predetermined temperature described later. Then, a high-frequency bias is applied to the substrate 11 side while a power is applied onto the side of an Al target made of metallic aluminum, and the intermediate layer 12 composed of AlN is formed on top of the substrate 11 while maintaining the pressure inside the furnace at a constant level.

As a method for forming the intermediate layer 12 on the substrate 11, in addition to a sputtering process as described in the present embodiment in which a high voltage is applied at a specified degree of vacuum for discharge, for example, an MOCVD method, a pulsed laser deposition (PLD) method in which plasma is generated by irradiating laser with a high energy density, a pulsed electron beam deposition (PED) method in which plasma is generated by irradiating electron beam, or the like may be exemplified and can be selected for use where appropriate. However, the sputtering process is preferable since it is the simplest method and is also suited for mass production. Note that when a DC sputtering process is employed, since the process tends to invite charge-up of the target surface and is prone to instability in the film formation rate, a pulsed DC sputtering process or an RF sputtering process is preferred.

In the sputtering process, a technique for improving efficiency by confining the plasma within a magnetic field and thereby increasing the plasma density is commonly employed, and a uniform film thickness can be achieved by moving the position of the magnet within the target to be sputtered. The specific method for moving the magnet may be selected in accordance with the sputtering apparatus being used, and magnets can be either swung or rotated. Such an RF sputtering process in which a layer is formed through a deposition process while swinging or rotating the magnet of a cathode is suitable in terms of the deposition efficiency, at the time of forming the intermediate layer 12 on the side surface of the substrate 11, which will be described later in detail.

(Pressure Inside Chamber)

When forming the intermediate layer 12 using a sputtering process, important parameters in the process other than the temperature of the substrate 11 include the pressure inside the chamber and the partial pressure of nitrogen.

When the intermediate layer 12 is formed using a sputtering process, the pressure inside the chamber 41 is preferably not less than 0.3 Pa. When the pressure inside this furnace is less than 0.3 Pa, the quantity of the nitrogen present becomes small and the energy carried by the nitrogen plasma particles becomes large, thereby causing damages to the substrate 11. In addition, in order to achieve the effects of cleaning with nitrogen plasma, it is thought to be effective to weaken the energy carried by particles to some extent and to increase the number of plasma particles. For this reason, although the upper limit for the pressure inside the furnace is not particularly limited, it is necessary to suppress the pressure to an extent so that a plasma can be generated.

(Ratio of Circulated Nitrogen)

The ratio of nitrogen in the combined circulation of nitrogen ($N_2$) and Ar is preferably equal to, or more than 20%, and also equal to, or less than 80%. When the ratio of nitrogen in the circulation is less than 20%, a sputtered metal may not be converted into a nitride and may adhere to the substrate 11 as an unmodified metal. When the ratio of nitrogen in the circulation exceeds 80%, the relative amount of Ar decreases, and thus a sputtering rate declines. It is particularly desirable that the ratio of nitrogen in the combined circulation of nitrogen ($N_2$) and Ar be within a range from 50% or more to 80% or less.

(Temperature)

The temperature of the substrate 11 during film formation of the intermediate layer 12 is preferably within a range from 300 to 800° C., and more preferably within a range from 400 to 800° C. When the temperature of the substrate 11 is less than the above-mentioned lower limit, the entire surface of the substrate 11 may not be covered by the intermediate layer 12, and portions of the surface of the substrate 11 may become exposed. When the temperature of the substrate 11 exceeds the above-mentioned upper limit, the energy carried by the sputtered particles which are adhered to the substrate 11 increases, and the intermediate layer cannot be formed while being orientated in a favorable manner, which is thought to be unsuitable in terms of the function thereof as a buffer layer.

(Film Formation Rate)

The film formation rate during formation of the intermediate layer 12 is preferably within a range from 0.01 nm/s to 10 nm/s. When the film formation rate is less than 0.01 nm/s, then the film grows into an island shape rather than a layer and it may become difficult to cover the surface of the substrate 11. On the other hand, when the film formation rate exceeds 10 nm/s, then the film may become amorphous rather than crystalline.

Note that in those cases where the intermediate layer 12 is formed by a sputtering process, conducting the film formation via a reactive sputtering process in which a group V source material circulated inside a reactor is preferred.

In general, in the sputtering process, the higher the purity of a target material, the more favorable the level of film quality, such as the level of crystallinity, of a thin film becomes following deposition. When forming the intermediate layer 12 with a sputtering process, although it is also possible to carry out a sputtering process with a plasma of inert gas such as Ar gas while using a group III nitride semiconductor as a target material that serves as a source material, a simple substance of a group III metal and a mixture thereof which is used as a target material in a reactive sputtering process can be purified to a higher extent, as compared to the group III nitride semiconductor. As a result, in the reactive sputtering process, it becomes possible to further improve the crystallinity of the intermediate layer 12 to be formed.

In addition, when making metallic materials into plasma using a sputtering process and depositing an alloy as an intermediate layer, metals which are to become targets may be prepared as a mixture of metallic materials (not necessarily forming an alloy) in advance, or two different materials may be prepared as two targets and may be simultaneously sputtered. For example, a target formed of mixed materials may be used when depositing a film with a given composition, and a plurality of targets may be placed inside a chamber when depositing several kinds of films with different compositions.

As a nitrogen source material used in the present embodiment, any generally known nitrogen compound can be used without any limitations, although ammonia and $N_2$ gas are preferred, as they are easy to handle and can be obtained comparatively cheaply.

Ammonia has a satisfactory degradation efficiency, and thus a film can be formed at a high growth rate. However, because ammonia has high reactivity and toxicity, a detoxification facility or a gas detector is required, and it is also necessary to select a chemically stable material as a member to be used in a reactor.

In addition, when nitrogen ($N_2$) is used as a source material, although a simple apparatus can be employed, high reaction rates cannot be attained. However, if a method is used in which the nitrogen gas is broken down using an electric field or heat or the like prior to introduction into the apparatus, then a film formation rate can be achieved which, although being lower than that obtained using ammonia, is still sufficient for use in industrial production, and therefore if due consideration is also given to the cost of the apparatus, $N_2$ gas is the most favorable nitrogen source.

In addition, it is preferable to form the intermediate layer 12 so as to cover the side surface of the substrate 11. Moreover, it is most preferable that the intermediate layer 12 is formed so as to cover the side surface as well as the back surface of the substrate 11.

In the manufacturing method of the present embodiment, as mentioned above, in the above-mentioned pretreatment step, a reverse sputtering process is conducted on the surface 11a of the substrate 11 to remove the impurities or the like on the surface 11a, and the intermediate layer 12 is formed on this cleaned surface 11a of the substrate 11 in the above-mentioned sputtering step. Accordingly, the intermediate layer 12 can be formed as a favorably orientated film in which the broad component 12c within the crystal organization thereof is made 30% or less in terms of the area ratio. As a result, since the level of crystallinity of the base layer 14a which is formed on top of the intermediate layer 12 and is composed of a group III nitride semiconductor can be improved, the crystallinity of the semiconductor layer 20 improves which includes the respective layers formed on the base layer 14a, i.e., the n-type contact layer 14b, the n-type cladding layer 14c, the light emitting layer 15 and the p-type semiconductor layer 16. Therefore, the light emitting device 1 configured by including the semiconductor layer 20 which is provided with such an excellent level of crystallinity will have superior light emitting properties.

[Sputtering Apparatus]

FIG. 5 shows an example of a sputtering apparatus used in the sputtering step as well as the pretreatment step of the present embodiment. In the sputtering apparatus 40 shown in the example of FIG. 5 is configured as an RF sputtering apparatus in which a magnet 42 is placed below a target 47 (at a lower section in FIG. 5), and the magnet 42 is swung below the target 47 by a drive apparatus which is not shown. Nitrogen gas and argon gas are fed to the chamber 41 that is provided in the sputtering apparatus, and the intermediate layer 12 is formed on top of the substrate 11 that is attached to a heater 44. During this process, since the magnet 42 is swung below the target 47 as described above, the plasma confined inside the chamber 41 moves around. As a result, it becomes possible to form an intermediate layer evenly not only on the surface 11a of the substrate 11 but also on a side of the substrate 11.

In those cases where an intermediate layer composed of a group III nitride compound is formed by a sputtering process as described in the manufacturing method of the present embodiment, a reactive sputtering process is generally used, in which a group III metal is used as a target and a nitrogen-containing gas (such as nitrogen ($N_2$) gas and ammonia ($NH_3$)) is introduced inside the chamber of a sputtering apparatus, thereby reacting the group III metal with nitrogen in a gaseous phase. As a sputtering process, an RF sputtering process and a DC sputtering process are available. However, when a reactive sputtering method is employed as in the manufacturing method according to the present invention, the level of electrification is too intense with the DC sputtering process which involves continuous discharge, making it difficult to control the film formation rate. For this reason, in the manufacturing method according to the present invention, the use of an RF sputtering process or a pulsed DC sputtering process where, among the various DC sputtering processes, a pulsed bias can be provided, is preferred. In addition, it is preferable to use a sputtering apparatus which is capable of conducting such sputtering processes.

In addition, when an RF sputtering process is employed, as a method in order to avoid the electrification, it is preferable to move the position of the magnet within the target. The specific method for moving the magnet may be selected in accordance with the sputtering apparatus being used, and magnets can be either swung or rotated.

In the sputtering apparatus 40 exemplified in FIG. 5, it is configured so that the magnet 42 is provided below the target 47 and the magnet 42 is being rotatable below the target 47.

When the intermediate layer 12 composed of a group III nitride compound through a sputtering process, it is preferable to supply a reactive species having even higher energy to the substrate 11. For this reason, it is preferable to configure the substrate 11 so that the substrate 11 is positioned within the plasma inside the sputtering apparatus 40, and that the substrate 11 is positioned opposite to the target 47. In addition, the distance between the substrate 11 and the target 47 is preferably within a range from 10 to 100 mm.

Moreover, because it is preferable that the amount of impurities remained inside the chamber 41 be as less as possible, it is preferable that the ultimate vacuum degree of the sputtering apparatus 40 be not more than $1.0 \times 10^{-3}$ Pa.

Further, in the manufacturing method of the present embodiment, as mentioned above, the pretreatment step and the sputtering step can be conducted using the same sputtering apparatus. In this case, a predetermined time interval may be provided between the pretreatment step and the sputtering step, and the atmospheric gas inside the chamber 41 may be replaced during this time interval.

[Formation of Semiconductor Layer]

The semiconductor layer 20 is formed by laminating the n-type semiconductor layer 14, the light emitting layer 15, and the p-type semiconductor layer 16 in this order on the intermediate layer 12. In the manufacturing method of the present embodiment, as mentioned above, the respective layers; i.e., the base layer 14a of the n-type semiconductor layer 14, the n-type contact layer 14b, the n-type cladding layer 14c, the light emitting layer 15, and the p-type semiconductor layer 16 are formed by an MOCVD method.

In the present embodiment, there are no particular limitations on the method for growing a gallium nitride based compound semiconductor when forming the semiconductor layer 20, and all the methods that are known to grow a nitride semiconductor such as the sputtering processes described above, a metalorganic chemical vapor deposition (MOCVD) method, a hydride vapor phase epitaxy (HVPE) method, and a molecular beam epitaxy (MBE) method can be applied. Among these methods, in the MOCVD method, hydrogen ($H_2$) or nitrogen ($N_2$) can be used as a carrier gas, trimethyl gallium (TMG) or triethyl gallium (TEG) can be used as a Ga source that represents the group III source material, trimethyl aluminum (TMA) or triethyl aluminum (TEA) can be used as an Al source, trimethyl indium (TMI) or triethyl indium (TEI) can be used as an In source, and ammonia ($NH_3$) or hydrazine ($N_2H_4$) can be used as an N source that represents a group V source material. In addition, in terms of dopant element n-type impurities, monosilane ($SiH_4$) or disilane ($Si_2H_6$) can be used as an Si source material, and germane gas ($GeH_4$) or an organogermanium compound such as tetramethyl germanium (($CH_3)_4Ge$) or tetraethyl germanium (($C_2H_5)_4Ge$) can be used as a Ge source material. In the MBE method, elemental germanium can also be used as a doping source. In terms of dopant element p-type impurities, for example, biscyclopentadienyl magnesium ($Cp_2Mg$) or bisethylcyclopentadienyl magnesium ($EtCp_2Mg$) can be used as an Mg source material.

The gallium nitride based compound semiconductor as described above can contain another group III element in addition to Al, Ga and In. Moreover, the gallium nitride based compound semiconductor can also contain dopant elements such as Ge, Si, Mg, Ca, Zn, Be, P and As where necessary. Furthermore, the elements contained are not limited to those added intentionally, and there are also cases where the semiconductor contains impurities that are inevitably included depending on the film forming conditions or the like as well as the trace impurities contained in the source materials and the reaction tube materials.

[Formation of n-Type Semiconductor Layer]

When forming the semiconductor layer 20 of the present embodiment, the base layer 14a of the n-type semiconductor layer 14 is first formed by being laminated on the intermediate layer 12 through a conventionally known MOCVD method. Subsequently, the n-type contact layer 14b and the n-type cladding layer 14c are formed on the base layer 14a through an MOCVD method. In this process, the respective layers; i.e., the base layer 14a, the n-type contact layer 14b, and the n-type cladding layer 14c can be formed using the same MOCVD furnace.

As a method for forming the base layer 14a composed of a single crystal of a group III nitride semiconductor on the substrate 11, for example, there is a method in which a low-temperature buffer layer composed of $Al_yGa_{1-y}N$ ($0 \leq y \leq 1$) is formed on the substrate 11 by an MOCVD method, and a single crystal of a GaN layer is then formed thereon by an MOCVD method at a temperature higher than that for forming the low temperature buffer layer. Alternatively, instead of forming the low temperature buffer layer by an MOCVD method, it is also possible to form a buffer layer composed of $Al_yGa_{1-y}N$ ($0 \leq y \leq 1$) by a sputtering process, and to then form a single crystal of a GaN layer thereon by an MOCVD method. Further, a single crystal of a GaN layer may also be formed using a sputtering process.

{Conditions for Forming a Semiconductor Layer by a Sputtering Process}

In those cases where a semiconductor layer composed of a group III nitride semiconductor is formed using a sputtering process, important parameters in the lamination step include the partial pressure of nitrogen-containing gas, the film formation rate, the substrate temperature, and the levels of applied bias and power.

(Gas Atmosphere)

As a gas atmosphere inside the chamber of the sputtering apparatus, an atmosphere composed of a nitrogen-containing gas (such as nitrogen ($N_2$) gas and $NH_3$ gas) and an inert gas is employed, and a hydrogen-containing gas ($H_2$) is circulated therethrough if needed. However, it is preferable to use an ammonia ($NH_3$) gas as a nitrogen-containing gas. Such nitrogen-containing gases are converted to plasma and then broken down into nitrogen atoms by a sputtering process, thereby forming source materials for growing crystals.

In addition, when using a hydrogen-containing gas for the gas atmosphere inside the chamber, migration of the reactive species is facilitated within the surface of a group III nitride semiconductor in the semiconductor laminating process, and it becomes possible to form an AlGaN film exhibiting an excellent level of crystallinity.

Moreover, in order to efficiently sputter the target, it is more preferable to make the atmosphere so that an inert gas such as argon (Ar) which is heavier and has low reactivity is further mixed therein. In such a case, the proportion of the nitrogen-containing gas within the gas atmosphere inside the chamber can be made, for example, within a range from 20% to 98%, in terms of the ratio of nitrogen gas circulated with respect to the combined amount of the nitrogen ($N_2$) gas and argon (Ar) gas circulated. When the ratio of the circulated nitrogen gas is less than 20%, a sputtered material may adhere as a metal without being modified. On the other hand, when the ratio of the circulated nitrogen gas exceeds 98%, the amount of argon is too low, which results in the decline of sputtering rates. In order to ensure a certain level of sputtering rate, it is necessary to make the proportion of an inert gas at least 2%.

In addition, in order to laminate a group III nitride semiconductor with a particularly favorable level of crystallinity, it is preferable that the proportion of the nitrogen-containing gas within the atmosphere inside the chamber be within a range from 20 to 80%, while the remainder being a gas containing an inert gas. As a result, it becomes possible to grow a group III nitride semiconductor exhibiting an even more favorable level of crystallinity.

As mentioned above, in the gas atmosphere inside the chamber, the remainder excluding the nitrogen-containing gas and hydrogen gas is preferably an inert gas. Because such an inert gas is used in order to efficiently sputter the target, it is preferable to use Ar or the like which is heavier and has low reactivity. Moreover, in the gas atmosphere, it is also possible to add other gaseous components as long as they do not inhibit the action of nitrogen-containing gas, hydrogen gas and inert gas.

(Substrate Temperature)

The temperature of the substrate 11 during formation of the semiconductor layer 20 by a sputtering process is preferably within a range from 300° C. to 1,200° C. When the present inventors conducted intensive and extensive studies, it became apparent that in order to form a semiconductor layer composed of a group III nitride semiconductor having a favorable level of crystallinity, it is, in general, preferable that the substrate temperature be within a range from 300° C. to 1,200° C. When the substrate temperature is lower than 300° C., migration of the reactive species within the substrate surface is suppressed, thereby making it difficult to form a group III nitride semiconductor exhibiting a favorable level of crystallinity. On the other hand, when the substrate temperature exceeds 1,200° C., the formed group III nitride semiconductor may break down again.

(Film Formation Rate)

The film formation rate during formation of the semiconductor layer 20 by a sputtering process is preferably within a range from 0.01 to 10 nm/second. When the film formation rate exceeds 10 nm/second, the laminated group III nitride semiconductor may become amorphous rather than forming crystals. On the other hand, when the film formation rate is less than 0.01 nm/second, the process is prolonged for no apparent reasons and thus becomes difficult to be used for industrial production.

(Power and Bias)

When forming the semiconductor layer 20 by a sputtering process, in order to activate the migration of reactive species within the surface of the substrate 11 while the crystals are growing, the greater the bias applied to the substrate side and the power applied to the target side, the better. For example, the bias applied to the substrate during film formation is preferably 1.5 W/cm$^2$ or greater, and the power applied to the target during film formation is preferably within a range from 1.5 W/cm$^2$ to 15 W/cm$^2$.

(Target)

The composition of the semiconductor layer formed by the manufacturing method of the present embodiment and composed of a group III nitride semiconductor can be controlled by adjusting the composition of a group III metal that is used as a target to a desired value. For example, when forming a layer composed of GaN, metallic Ga may be used as a target, whereas when forming an AlGaN layer, an AlGa alloy may be used as a target.

Similarly, when forming an InGaN layer, an InGa alloy may be used. Since the composition of the group III nitride semiconductor changes in accordance with the composition of a group III metal used as a target, by experimentally determining the composition of the target 47, it becomes possible to form a semiconductor layer composed of a group III nitride semiconductor having a desired composition.

Alternatively, for example, when laminating an AlGaN layer, it is also possible to place both metallic Ga and metallic Al as targets. In this case, by changing the ratio of the surface areas of the metallic Ga target and metallic Al target, it becomes possible to control the composition of the AlGaN layer which is to be laminated. Similarly, when laminating an InGaN layer, it is also possible to place both a metallic Ga target and a metallic In target.

In addition, the doping of impurities to a group III nitride semiconductor may be conducted using a mixed target in which a group III metal and an impurity are mixed. For example, when forming a GaN layer doped with a Si (in this case, a p-type semiconductor layer) using a sputtering process, it is possible to use a mixed target containing metallic Ga and Si. In such a case, by preparing a state where Si is dissolved in a metallic Ga solid and using a solid solution of metallic Ga where Si is dissolved as a target, a GaN layer doped with Si can be formed. Moreover, it is also possible to place small pieces of metallic Ga and Si separately and to use them as targets. In this case, by experimentally determining adequate proportions for Ga and Si which will be used as targets, a GaN layer with a desired impurity concentration can be formed.

In addition, as alternative methods, a method in which a target composed of a dopant element is placed inside the chamber and is then sputtered, a method in which a dopant element is supplied to the inside of a chamber or to a wafer as ions or gas (vapor), or the like can be used. Examples of the advantages in adopting these methods include a prolonged stability of the formed layers can be achieved since the amount of dopant can be controlled depending on the types of targets or in accordance with the changes in the film formation conditions.

[Formation of Light Emitting Layer]

The light emitting layer 15 is formed on top of the n-type cladding layer 14c through a conventionally known MOCVD method.

The light emitting layer 15 formed in the present embodiment as exemplified in FIG. 1 has a laminate structure starting with a GaN barrier layer and ending with another GaN barrier layer, and is formed by alternately laminating 6 layers of barrier layers 15a composed of GaN and 5 layers of well layers 15b composed of undoped $In_{0.2}Ga_{0.8}N$.

In addition, in the manufacturing method of the present embodiment, the light emitting layer 15 can be formed by using a conventionally known MOCVD method by using the same MOCVD furnace as that used for forming the n-type cladding layer 14c.

[Formation of p-Type Semiconductor Layer]

The p-type semiconductor layer 16 composed of a p-type cladding layer 16a and a p-type contact layer 16b is formed, using a conventionally known MOCVD method, on the light emitting layer 15, in other words, on the bather layer 15a that is serving as the uppermost layer of the light emitting layer 15.

In the present embodiment, the p-type cladding layer 16a composed of Mg-doped $Al_{0.1}Ga_{0.9}N$ is first formed on the light emitting layer 15 (on the uppermost barrier layer 15a), and then the p-type contact layer 16b composed of Mg-doped $Al_{0.02}Ga_{0.98}N$ is formed thereon. In this process, the same MOCVD apparatus can be used for laminating the p-type cladding layer 16a and the p-type contact layer 16b.

[Formation of Translucent Positive Electrode]

By using the method as described above, the translucent positive electrode 17 composed of ITO is formed on the p-type contact layer 16b of the laminated semiconductor 10, in which the intermediate layer 12 and a semiconductor layer are laminated on the substrate 11.

There are no particular limitations on the method for forming the translucent positive electrode 17 and the translucent positive electrode 17 can be formed through conventional procedures well known in this technical field. In addition, also in terms of the structure thereof, any structure may be used without any particular limitations, including any of the conventionally known structures.

Moreover, as described above, the material used for the translucent positive electrode 17 is not limited to ITO, and the translucent positive electrode 17 can be formed using other materials such as AZO, IZO, and GZO.

Additionally, after forming the translucent positive electrode 17, a thermal annealing process may be conducted for alloying or increasing transparency, or it may not be conducted.

[Formation of Positive Electrode Bonding Pad and Negative Electrode]

A positive electrode bonding pad 18 is further formed on the transparent positive electrode 17 that is formed on the laminated semiconductor 10.

This positive electrode bonding pad 18 can be formed by, for example, laminating each material, that is, Ti, Al, and Au, in this order starting from the surface side of the translucent positive electrode 17 using a conventionally known method.

In addition, when forming the negative electrode 19, portions of the p-type semiconductor layer 16, the light emitting layer 15 and the n-type semiconductor layer 14 which are formed on the substrate 11 are first removed by a method such as a dry etching process to expose the n-type contact layer 14b and thereby forming an exposed area 14d (refer to FIG. 2 and FIG. 3). The negative electrode 19 having a 4-layer structure can be formed on this exposed area 14d by, for example, laminating each material, that is, Ni, Al, Ti, and Au, in this order starting from the surface side of the exposed area 14d by a conventionally known method.

Then, after grinding and polishing the back surface of the substrate 11 to form a mirror-like surface, a wafer, in which the translucent positive electrode 17, the positive electrode bonding pad 18, and the negative electrode 19 are formed on the laminated semiconductor 10 via the procedure described above, is then cut into square chips having a side length of 350 µm so as to form a light emitting device chip (light emitting device 1).

According to the method for manufacturing a group III nitride semiconductor light emitting device 1 according to the present embodiment as described above, a pretreatment step in which the substrate 11 is subjected to a plasma treatment, and a sputtering step following the pretreatment step in which the intermediate layer 12 is formed on top of the substrate 11 by a sputtering process are provided. It is a method in which, in the sputtering step, when components are separated, based on a peak separation technique using the X-ray rocking curve of the intermediate layer 12, into a broad component 12c having the full width at half maximum of 720 arcsec or more and corresponds to a non-orientating component within the crystal organization of the intermediate layer 12 and a narrow component 12b, the intermediate layer 12 is formed so that the proportion of the broad component 12c within the crystal organization of the intermediate layer 12 is 30% or less in terms of the area ratio of the intermediate layer 12. Accordingly, the impurities or the like on the substrate 11 are reliably removed, and the intermediate layer 12 having a highly uniform crystal organization and a favorable level of orientation properties can be grown. As a result, the lattice mismatch between the substrate 11 and the semiconductor layer 20 that is composed of a group III nitride semiconductor grown on the intermediate layer 12 does not occur, and thus the semiconductor layer 20 exhibiting a favorable level of crystallinity can be formed. In addition, because the method specifies each condition in the pretreatment step and controls the orientation properties of the intermediate layer 12 and the crystallinity of the base layer 14a by using the proportion of the broad component within the crystal organization of the intermediate layer 12 as an indicator, it becomes possible to accurately control the respective manufacturing conditions without being dependent on the performance of the sputtering apparatus used. Therefore, it becomes possible to manufacture a group III nitride semiconductor light emitting device exhibiting excellent light emitting properties at a high production efficiency.

Note that the group III nitride semiconductor obtained by the manufacturing method according to the present invention as the laminated semiconductor 10 shown in FIG. 1 can be used for various semiconductor devices including a light emitting diode (LED), light emitting devices such as a laser disc (LD) and electronic devices such as a transistor.

[Lamp]

A lamp can be configured using techniques known to those skilled in the art by combining a group III nitride semiconductor light emitting device according to the present invention as described above and a phosphor. Techniques for changing the light emission color by combining a light emitting device and a phosphor are conventionally well known, and these types of techniques can be adopted without any particular limitations.

For example, by appropriate selection of a phosphor, light emission having a longer wavelength than that of the light emitting device can be achieved. Moreover, by mixing the emission wavelength of the light emitting device itself and the wavelength that has been changed by the phosphor, a lamp that emits white light can also be obtained.

In addition, the lamp configured in such a manner can be used for any types of lamps such as a general-purpose cannonball shaped lamp, a side view type lamp for a backlight of a mobile phone, or a top view type lamp used for a display device.

Figure 4:
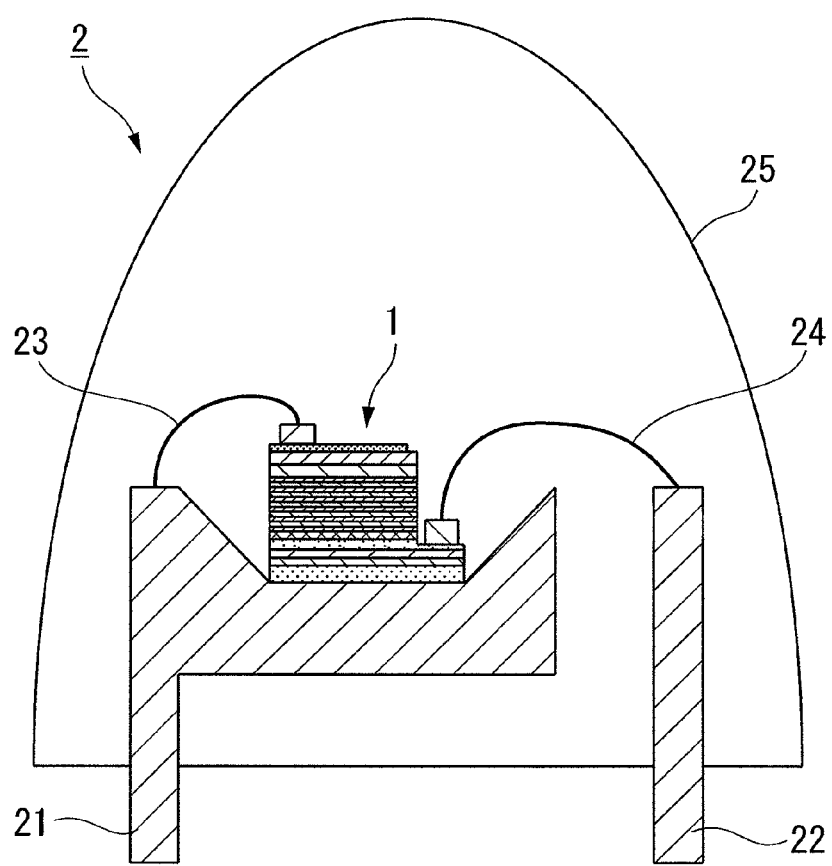
FIG. 4 is a diagram schematically describing a lamp that is constituted by using a group III nitride semiconductor light emitting device according to the present invention.

For example, when a group III nitride semiconductor light emitting device 1 of the same electrode type is mounted in a cannonball shaped lamp as exemplified in FIG. 4, the light emitting device 1 is bonded to one of the two frames (the frame 21 in FIG. 4) while the negative electrode of the light emitting device 1 (refer to a constituent attached with the reference numeral 19 in FIG. 3) is connected to the other frame 22 using a wire 24 and the positive electrode bonding pad of the light emitting device 1 (refer to a constituent attached with the reference numeral 18 in FIG. 3) is connected to the frame 21 using a wire 23. Further, by sealing the periphery around the light emitting device 1 with a mold 25 constituted of a transparent resin, a cannonball shaped lamp 2 as shown in FIG. 4 can be produced.

Because the lamp 2 of the present embodiment is constituted using the above-mentioned group III nitride semiconductor light emitting device of the present invention or the group III nitride semiconductor light emitting device obtained by the above-mentioned manufacturing method of the present invention, excellent light emitting properties can be attained.

In addition, the semiconductor as shown in the laminated semiconductor 10 in FIG. 1 obtained using the manufacturing method according to the present invention can also be used for photoelectric conversion devices such as a laser device and a light receiving device, electronic devices such as a heterojunction bipolar transistor (HBT) and a high electron mobility transistor (HEMT), or the like, in addition to the light emitting devices as described above. Numerous semiconductor devices of these types with various structures are already known, and any device structures including these known device structures can be adopted for a laminate structure of the group III nitride semiconductor according to the present invention without any limitations.

EXAMPLES

Next, the group III nitride semiconductor light emitting device and the manufacturing thereof according to the present invention will be described below in more detail with reference to a series of working examples. However, the present invention is not limited to these working examples.

Experimental Example 1

In the present example, a sample of a light emitting diode (LED) as shown in FIG. 2 and FIG. 3 was prepared (refer also to the laminated semiconductor 10 in FIG. 1) by forming an intermediate layer on a substrate on which a reverse sputtering process had been conducted, and then laminating the respective layers composed of group III nitride semiconductors thereon.

In the present example, an intermediate layer 12 composed of AlN was first laminated on top of a substrate 11 made of sapphire using an RF sputtering process, and a base layer 14a composed of a single crystal of GaN was then laminated thereon using an MOCVD method. Then, on top of this base layer 14a, the respective layers; i.e., the n-type contact layer 14b, the n-type cladding layer 14c, the light emitting layer 15, and the p-type semiconductor layer 16 were formed through an MOCVD method.

[Reverse Sputtering Process Conducted on a Substrate (Pretreatment Step)]

First, a (0001) c-plane sapphire substrate that had been polished to a mirror surface and had a diameter of 2 inches was washed with hydrofluoric acid and an organic solvent, and was then placed inside a chamber of a sputtering apparatus. In this process, as a sputtering apparatus, an apparatus having a high frequency power supply and also having a mechanism which was capable of moving the position of a magnetic field by rotating a magnet within a target was used.

Subsequently, the substrate 11 was heated to 550° C. inside the chamber of the sputtering apparatus, and nitrogen gas was then introduced at a flow rate of 40 sccm, thereby making the gas atmosphere inside the chamber, 100% nitrogen gas. Thereafter, with the pressure inside the chamber maintained at 2 Pa, the substrate 11 was exposed to nitrogen plasma while applying a high frequency bias of 0.1 kW thereto so that the surface of the substrate 11 was cleaned by being subjected to a plasma treatment through a reverse sputtering process. The time for conducting this treatment was 15 seconds.

[Formation of Intermediate Layer (Sputtering Step)]

Subsequently, after introducing argon gas and nitrogen gas inside the chamber, with the temperature of the substrate 11 held at 550° C., the intermediate layer 12 composed of AlN was formed on top of the substrate 11 made of sapphire under the conditions where a high-frequency bias of 1 kW was applied to the metallic Al target side, the pressure inside the furnace was kept at 1 Pa, and the Ar gas and the nitrogen gas were circulated so that their flow rates were 10 sccm and 30 sccm, respectively (the ratio of nitrogen with respect to the entire gas was 75%). The growth rate of the resulting layer in this process was 0.12 nm/s.

Note that the magnet within the target was rotated in both occasions during the reverse sputtering process conducted on the substrate 11 and during the formation of the intermediate layer 12. After forming the intermediate layer 12 having a thickness of 40 nm and was composed of AlN in the above-mentioned manner, plasma formation was halted and the temperature of the substrate 11 was lowered. By following the above procedures, the intermediate layer 12 composed of a single AlN crystal having a thickness of 40 nm was formed on top of the substrate 11.

Then, regarding the crystal organization of the intermediate layer 12 formed in the above-mentioned manner, by using a CuKα X-ray beam generation source as the X-ray source and also using an X-ray measuring apparatus (model: X'part apparatus, manufactured by PANalytical Inc.), in which the angle of divergence was made 0.01° by the use of a parabolic mirror and two crystals, the X-ray rocking curve was measured, followed by the analysis thereof using a data analysis software ("Peak Fit (registered trademark)" manufactured by Systat Software, Inc.). In this process, by using "AutoFit Peaks I" and "Gaussian-Lorentzian Sum (Amplitude)" as a fitting method and a fitting function, respectively, in the above-mentioned "Peak Fit (registered trademark)" software, the proportion of the broad component within the crystal organization of the intermediate layer 12 was analyzed.

In addition, the X-ray rocking curve (XRC) for the intermediate layer 12 was measured using an X-ray measuring apparatus (model: X'part, manufactured by PANalytical Inc.). The measurement was conducted using a CuKα X-ray beam generation source as the X-ray source.

As a result, in the crystal organization of the intermediate layer 12, the proportion of the broad component which was in a non-orientated state showed a low value of 19%, whereas the XRC full width at half maximum was 0.106 (381 arcsec) showing excellent properties, and thus it was confirmed that the intermediate layer 12 was orientated in a favorable manner.

[Formation of Base Layer]

Subsequently, the substrate 11 having the intermediate layer 12 formed on the surface thereof was removed from the sputtering apparatus and was then placed inside an MOCVD furnace. A sample having a GaN layer (group III nitride semiconductor) formed thereon was prepared using the following procedures.

First, the substrate 11 was introduced to the inside of a reaction furnace. The substrate 11 was placed on a carbon susceptor used for heating within a glove box, the inside of which was substituted with nitrogen gas. Then, following the circulation of nitrogen gas inside the furnace, the temperature of the substrate 11 was increased to 1,150° C. using the heater. Then, once it was confirmed that the temperature of the substrate 11 was stabilized at a temperature of 1,150° C., the circulation of ammonia gas inside the furnace was commenced by opening a valve of the ammonia piping. Subsequently, hydrogen gas containing trimethyl gallium (TMG) vapor was then supplied to the inside of the furnace, thereby conducting a treatment where a GaN based semiconductor that forms the base layer 14a was adhered onto the intermediate layer 12 formed on top of the substrate 11. The amount of ammonia was adjusted so as to achieve the (group V element)/(group III element) ratio of 6,000. After growing the above-mentioned GaN based semiconductor over a period of approximately one hour, by switching a valve of the TMG piping, supply of the source materials to the reaction furnace was then halted, thereby halting the growth of the GaN layer. Subsequently, following completion of the growth of the GaN-based semiconductor, power supply to the heater was halted, and the temperature of the substrate 11 was reduced down to room temperature.

Using the types of procedures described above, the intermediate layer 12 having a single crystal structure and was composed of AlN was formed on top of the substrate 11 made of sapphire, and the base layer 14a composed of an undoped GaN-based semiconductor and having a film thickness of 2 μm was then formed thereon. Upon removal, the substrate had a colorless, transparent, mirror-like appearance.

The X-ray rocking curve (XRC) for the base layer 14a which was formed in the above-mentioned manner and was composed of an undoped GaN layer was measured using an X-ray measuring apparatus (model: X'part, manufactured by PANalytical Inc.). The measurement was conducted using a CuKα X-ray beam generation source as the X-ray source, and was conducted for the symmetrical (0002) plane. Generally, in the case of a group III nitride semiconductor, the spectral full width at half maximum in the XRC of the (0002) plane acts as an indicator of the crystal smoothness (mosaicity). As a result of this measurement, it was revealed that for the base layer 14a prepared using the manufacturing method of the present invention, the full width at half maximum value was 0.0101 (36.5 arcsec) in the measurement of the (0002) plane.

[Formation of n-Type Contact Layer]

Subsequently, the substrate 11 having the base layer 14a formed thereon was transferred to the inside of an MOCVD apparatus, and an n-type contact layer composed of GaN was formed using an MOCVD method. During this process, the n-type contact layer was doped with Si.

Here, a conventionally known MOCVD apparatus was used for forming a GaN layer.

Using the types of procedures described above, the intermediate layer 12 composed of AlN having a single crystal structure was formed on the substrate 11, which was made of sapphire and was subjected to a reverse sputtering process, and an undoped GaN layer (the n-type base layer 14a) with a film thickness of 2 μm and an Si-doped GaN layer (the n-type contact layer 14b) with a film thickness of 2 μm and having a carrier concentration of $5 \times 10^{18}$ cm$^{-3}$ were then formed on the intermediate layer 12. Following film formation, the substrate removed from the apparatus was colorless and transparent, and the surface of the GaN layer (the n-type contact layer 14b in this case) had a mirror-like appearance.

[Formation of n-Type Cladding Layer and Light Emitting Layer]

Using an MOCVD method, the n-type cladding layer 14c and the light emitting layer 15 were laminated on top of the n-type contact layer of the sample which was prepared using the procedure described above.

[Formation of n-Type Cladding Layer]

First, the substrate having the n-type contact layer composed of an Si-doped GaN layer grown thereon was transferred to the inside of a chamber of an MOCVD apparatus. Then, the temperature of the substrate was increased to 1,000° C. while replacing the gas inside the chamber with nitrogen, and the dirt adhered onto the uppermost surface of the n-type contact layer was removed by sublimation. In addition, during this process, ammonia gas was circulated inside the furnace from the time point where the temperature of the substrate reached 830° C. or higher.

Subsequently, after reducing the temperature of the substrate down to 740° C., with ammonia gas still circulating inside the chamber, $SiH_4$ gas and vapors of TMI and TEG generated by bubbling were supplied to the furnace, thereby forming an n-type cladding layer 14c having a film thickness of 180 Å and composed of Si-doped $In_{0.01}Ga_{0.99}N$ layer. Then, by switching the valves for TMI, TEG, and $SiH_4$, supply of these source materials was halted.

[Formation of Light Emitting Layer]

Subsequently, the light emitting layer 15 was formed, which was constituted of a barrier layer 15a composed of GaN and a well layer 15b composed of $In_{0.2}Ga_{0.8}N$, and which had a multiple quantum well structure. In order to form this light emitting layer 15, the barrier layer 15a was first formed on the n-type cladding layer 14c composed of Si-doped $In_{0.01}Ga_{0.99}N$, and the well layer 15b composed of $In_{0.2}Ga_{0.8}N$ was then formed on top of this barrier layer 15a. This type of lamination procedure was repeated five times, and a sixth barrier layer 15a was then formed on top of the fifth laminated well layer 15b, thereby forming a structure in which a barrier layer 15a was positioned at both sides of the light emitting layer 15 having a multiple quantum well structure.

In other words, following the growth of the n-type cladding layer 14c composed of Si-doped $In_{0.01}Ga_{0.99}N$, with the temperature of the substrate, pressure inside the furnace, and the flow rate and the types of carrier gas being unchanged, TEG was supplied to the furnace by switching the valve of TEG, thereby growing a barrier layer 15a composed of GaN. As a result, the barrier layer 15a with a film thickness of 150 Å was formed.

Subsequently, following formation of the barrier layer 15a, with the temperature of the substrate 11, pressure inside the furnace, and the flow rate and the types of carrier gas being unchanged, TEG and TMI were supplied to the furnace by switching the valves of TEG and TMI, thereby forming a well layer 15b composed of $In_{0.2}Ga_{0.8}N$. As a result, the well layer 15b with a film thickness of 20 Å was formed.

Following completion of the growth of the well layer 15b, the barrier layer 15a was grown once again. Then, by repeating such procedures five times, five barrier layers 15a and five well layers 15b were formed. Furthermore, on top of the well layer 15b which was laminated last, another barrier layer 15a was formed, thereby completing the formation of the light emitting layer 15.

[Formation of p-Type Semiconductor Layer]

On top of a wafer obtained by the treatments described in the above respective steps, the p-type semiconductor layer 16 was formed using an MOCVD apparatus.

Here, a conventionally known MOCVD apparatus was used for forming the p-type semiconductor layer 16. Moreover, in this process, the p-type semiconductor layer 16 was doped with Mg.

Then, as a result, the p-type semiconductor layer 16 was finally formed which was constituted of the p-type cladding layer 16a composed of Mg-doped $Al_{0.1}Ga_{0.9}N$ with a film thickness of 10 nm and the p-type contact layer 16b composed of Mg-doped $Al_{0.02}Ga_{0.98}N$ with a film thickness of 200 nm.

An epitaxial wafer for LED prepared in the above-mentioned manner had a structure, as the laminated semiconductor 10 shown in FIG. 1, in which an MN layer having a single crystal structure (the intermediate layer 12) was formed on top of the substrate 11 having a c-plane and made of sapphire, and then, from the substrate 11 side, the following layers were laminated in this order; i.e., an undoped GaN layer (the base layer 14a) with a film thickness of 2 μm, an Si-doped GaN layer (the n-type contact layer 14b) with an electron concentration of $5\times10^{18}$ $cm^{-3}$ and having a film thickness of 2 μm, an $In_{0.01}Ga_{0.99}N$ cladding layer (the n-type cladding layer 14c) with an electron concentration of $1\times10^{18}$ $cm^{-3}$ and having a film thickness of 180 Å, a multiple quantum well structure (the light emitting layer 15), which started with one GaN barrier layer and ended with another GaN barrier layer, constituted of six layers of GaN barrier layers (the barrier layer 15a) having a layer thickness of 150 Å and five layers of undoped $In_{0.2}Ga_{0.8}N$ well layers (the well layer 15b) having a layer thickness of 20 Å, and the Mg-doped AlGaN layer (the p-type semiconductor layer 16) constituted of the p-type cladding layer 16a composed of Mg-doped $Al_{0.1}Ga_{0.9}N$ with a film thickness of 10 nm and the p-type contact layer 16b composed of Mg-doped $Al_{0.02}Ga_{0.98}N$ with a film thickness of 200 nm.

[Preparation of LED]

The epitaxial wafer (laminated semiconductor 10) obtained as described above was then used to prepare an LED.

In other words, a conventional photolithography technique was used to form a translucent positive electrode 17 composed of ITO on the surface of the Mg-doped AlGaN layer (the p-type contact layer 16b) of the above-mentioned epitaxial wafer, and a positive electrode bonding pad 18 (a p-electrode bonding pad) was formed by sequentially laminating titanium, aluminum and gold onto the translucent positive electrode 17, thus completing the p-side electrode. The wafer was then subjected to a dry etching process to expose a region of the n-type contact layer 14b for forming an n-side electrode (the negative electrode), and the negative electrode 19 (the n-side electrode) was then formed by sequentially laminating four layers, namely Ni, Al, Ti and Au, onto this exposed area 14d. Using such a procedure, electrodes having the shapes as shown in FIG. 2 were formed on the wafer (refer to the laminated semiconductor 10 in FIG. 1).

The back surface of the substrate 11 made of sapphire within the wafer where the p-side and n-side electrodes were formed via the procedure outlined above was then ground and polished to form a mirror-like surface. The wafer was then cut into square chips having a side length of 350 μm, the chip was then positioned on a lead frame so that each electrode was facing upwards, and gold wiring was used to connect the electrodes to the lead frame, thus forming a light emitting device (refer to the lamp 3 in FIG. 4).

When a forward current was caused to flow between the p-side and n-side electrodes of the light emitting diode prepared as described above, the forward voltage at a current of 20 mA was 3.25 V. In addition, when the state of light emission was observed through the p-side translucent positive electrode 17, the emission wavelength was 462 nm and the light emission output was 12.5 mW. In the produced light emitting diodes, these types of light emission properties were obtained with minimal variation across almost the entire surface of the wafer.

Experimental Examples 2 to 15

The light emitting devices of Experimental Examples 2 to 15 were prepared under the same film forming conditions as those described in the above-mentioned Experimental Example 1 except that the pretreatment step and the sputtering step were conducted under those conditions shown in the following Table 1.

Here, Experimental Example 3 was an example where the gas pressure inside the chamber in the pretreatment step was set to a somewhat low level of 0.08 Pa, and Experimental Example 7 was an example where no nitrogen was included in the gas atmosphere in the pretreatment step.

In addition, in the present series of experimental examples, in terms of the treatment time for the pretreatment step, it was set to a short period of time of 30 seconds or less in Experimental Example 4 and Experimental Examples 6 to 10, whereas it was set to a longer period of 60 seconds to 300 seconds in other experimental examples.

The respective manufacturing conditions for the above-mentioned Experimental Examples 1 to 15 are shown in the following Table 1, while the list of evaluation results is shown in the following Table 2.

TABLE 1

| Sample | Conditions for plasma treatment step (reverse sputtering conducted on substrate) | | | | | | |
|---|---|---|---|---|---|---|---|
| | High-frequency power (kW) | Gas pressure (Pa) | Gas flow rate (sccm) Nitrogen ($N_2$) | Gas flow rate (sccm) Argon (Ar) | Nitrogen ratio (%) | Treatment time (seconds) | Treatment temperature (° C.) |
| Exp. Ex. 1 | 0.1 | 2 | 40 | 0 | 100 | 15 | 550 |
| Exp. Ex. 2 | 0.05 | 1 | 30 | 0 | 100 | 300 | 750 |
| Exp. Ex. 3 | 0.05 | 0.08 | 15 | 0 | 100 | 300 | 750 |
| Exp. Ex. 4 | 0.1 | 1 | 40 | 0 | 100 | 30 | 800 |
| Exp. Ex. 5 | — | — | — | — | — | — | — |
| Exp. Ex. 6 | 0.1 | 1 | 20 | 20 | 50 | 30 | 800 |
| Exp. Ex. 7 | 0.1 | 1 | 0 | 40 | 0 | 30 | 800 |
| Exp. Ex. 8 | 0.1 | 1 | 40 | 0 | 100 | 30 | 800 |
| Exp. Ex. 9 | 0.1 | 1 | 40 | 0 | 100 | 10 | 800 |
| Exp. Ex. 10 | 0.1 | 1 | 40 | 0 | 100 | 1 | 800 |
| Exp. Ex. 11 | 0.1 | 1 | 40 | 0 | 100 | 60 | 800 |
| Exp. Ex. 12 | 0.05 | 0.08 | 15 | 0 | 100 | 300 | 750 |
| Exp. Ex. 13 | 0.02 | 0.08 | 15 | 0 | 100 | 300 | 750 |
| Exp. Ex. 14 | 0.1 | 0.08 | 15 | 0 | 100 | 300 | 750 |
| Exp. Ex. 15 | 0.2 | 0.08 | 15 | 0 | 100 | 300 | 750 |

| Sample | Conditions for sputtering step (formation of intermediate layer) | | | | | | |
|---|---|---|---|---|---|---|---|
| | High-frequency power (kW) | Gas pressure (Pa) | Gas flow rate (sccm) Nitrogen ($N_2$) | Gas flow rate (sccm) Argon (Ar) | Nitrogen ratio (%) | Treatment time (minutes) | Treatment temperature (° C.) |
| Exp. Ex. 1 | 1 | 1 | 30 | 10 | 75 | 2 | 550 |
| Exp. Ex. 2 | 2 | 0.5 | 15 | 5 | 75 | 10 | 750 |
| Exp. Ex. 3 | 2 | 0.5 | 15 | 5 | 75 | 10 | 750 |
| Exp. Ex. 4 | 0.5 | 0.5 | 30 | 10 | 75 | 5 | 800 |
| Exp. Ex. 5 | 0.5 | 0.5 | 30 | 10 | 75 | 5 | 800 |
| Exp. Ex. 6 | 0.5 | 0.5 | 30 | 10 | 75 | 5 | 800 |
| Exp. Ex. 7 | 0.5 | 0.5 | 30 | 10 | 75 | 5 | 800 |
| Exp. Ex. 8 | 1 | 1 | 30 | 10 | 75 | 2 | 800 |
| Exp. Ex. 9 | 1 | 1 | 30 | 10 | 75 | 2 | 800 |
| Exp. Ex. 10 | 1 | 1 | 30 | 10 | 75 | 2 | 800 |
| Exp. Ex. 11 | 1 | 1 | 30 | 10 | 75 | 2 | 800 |
| Exp. Ex. 12 | 2 | 0.5 | 15 | 5 | 75 | 10 | 750 |
| Exp. Ex. 13 | 2 | 0.5 | 15 | 5 | 75 | 10 | 750 |
| Exp. Ex. 14 | 2 | 0.5 | 15 | 5 | 75 | 10 | 750 |
| Exp. Ex. 15 | 2 | 0.5 | 15 | 5 | 75 | 10 | 750 |

TABLE 2

| Sample | Cystal properties of intermediate layer | | Base layer | Properties of light emitting device | | | Note |
|---|---|---|---|---|---|---|---|
| | Proportion of broad component (%) | Full width at half maximum in XRC | Full width at half maximum in XRC | Forward voltage (V) | Emission wavelength (nm) | Light emission output (mW) | |
| Exp. Ex. 1 | 19.0 | 381.6 | 36.5 | 3.2 | 462 | 12.5 | |
| Exp. Ex. 2 | 26.2 | 337.0 | 48.9 | 3.2 | 462 | 12.5 | |
| Exp. Ex. 3 | 76.0 | 584.3 | 134.8 | 3.4 | 463 | 11 | |
| Exp. Ex. 4 | 19.9 | 419.0 | 38.1 | 3.2 | 462 | 12.5 | |

TABLE 2-continued

| Sample | Crystal properties of intermediate layer | | Base layer | Properties of light emitting device | | | Note |
| --- | --- | --- | --- | --- | --- | --- | --- |
| | Proportion of broad component (%) | Full width at half maximum in XRC | Full width at half maximum in XRC | Forward voltage (V) | Emission wavelength (nm) | Light emission output (mW) | |
| Exp. Ex. 5 | 50.4 | 416.5 | 90.7 | 3.3 | 463 | 12 | No plasma treatment step |
| Exp. Ex. 6 | 22.6 | 443.5 | 42.7 | 3.2 | 462 | 12.5 | |
| Exp. Ex. 7 | 100.0 | 7381.4 | 176.2 | 3.4 | 463 | 11 | |
| Exp. Ex. 8 | 21.8 | 383.4 | 41.3 | 3.2 | 462 | 12.5 | |
| Exp. Ex. 9 | 25.2 | 393.1 | 47.2 | 3.2 | 462 | 12.5 | |
| Exp. Ex. 10 | 22.8 | 392.0 | 43.1 | 3.2 | 462 | 12.5 | |
| Exp. Ex. 11 | 60.7 | 443.9 | 108.4 | 3.2 | 462 | 12 | |
| Exp. Ex. 12 | 20.0 | 349.9 | 38.2 | 3.2 | 462 | 12.5 | |
| Exp. Ex. 13 | 19.1 | 340.2 | 36.7 | 3.2 | 462 | 12.5 | |
| Exp. Ex. 14 | 84.0 | 839.5 | 148.6 | 3.4 | 463 | 11 | |
| Exp. Ex. 15 | 95.9 | 1818.0 | 169.1 | 3.4 | 463 | 11 | |

[Evaluation Results]

As shown in Table 1, with respect to the light emitting devices which were prepared by conducting a reverse sputtering process on the substrate in the pretreatment step provided in the manufacturing method of the present invention, and were also manufactured by the respective conditions specified in the present invention (refer to Experimental Examples 1, and 8 to 10), it was evident that orientation properties were excellent, in which the proportion of the broad component within the crystal organization of the intermediate layer was 30% or less, in terms of the area ratio in the surface of the intermediate layer, in all the cases, and the full width at half maximum in X-ray rocking curve for the base layer formed on top of the intermediate layer was 50 arcsec or less, which also showed superior orientation properties. Moreover, with respect to such light emitting devices of the present invention formed by the lamination of each group III nitride semiconductor layer on top of a base layer, the forward voltage at a current of 20 mA was 3.25 V or less in all the cases, and also exhibited highly superior light emitting properties where the emission wavelength was 460 to 464 nm and the light emission output was 12.5 mW or higher.

Further, with respect to the sample obtained in Experimental Example 2, although the treatment time in the pretreatment step was 300 seconds which was relatively long, because the level of power applied or the gas pressure inside the chamber was within the range specified in the present invention, the proportion of the broad component within the crystal organization of the intermediate layer was 26.2%, showing a relatively favorable level of orientation properties.

In addition, with respect to the sample obtained in Experimental Example 3, since the gas pressure in the pretreatment step was 0.08 Pa which was relatively low and also the treatment time was 300 seconds which was relatively long, the proportion of the broad component within the crystal organization of the intermediate layer was 76%, showing an unfavorable level of orientation properties.

Further, with respect to the sample obtained in Experimental Example 4, since the treatment time in the pretreatment step was 30 seconds, and the level of power applied or the gas pressure inside the chamber was also within the range specified in the present invention, the proportion of the broad component within the crystal organization of the intermediate layer was 19.9%, showing a favorable level of orientation properties.

In addition, with respect to the sample obtained in Experimental Example 5, since no step was provided for pretreating the substrate, the proportion of the broad component within the crystal organization of the intermediate layer was 50.4%, showing an unfavorable level of orientation properties.

Further, with respect to the sample obtained in Experimental Example 6, as with Experimental Example 4, since the treatment time in the pretreatment step was 30 seconds, and the level of power applied or the gas pressure inside the chamber was also within the range specified in the present invention, the proportion of the broad component within the crystal organization of the intermediate layer was 22.6%, showing a favorable level of orientation properties.

In addition, with respect to the sample obtained in Experimental Example 7, since no nitrogen gas was circulated inside the chamber in the pretreatment step, the proportion of the broad component within the crystal organization of the intermediate layer was 100%, the results showing no orientation at all.

Further, with respect to the sample obtained in Experimental Example 11, since the treatment time in the pretreatment step was 60 seconds which was relatively long, the proportion of the broad component within the crystal organization of the intermediate layer was 60.7%, showing an unfavorable level of orientation properties.

In addition, with respect to the sample obtained in Experimental Example 12, since the gas pressure in the pretreatment step was 0.08 Pa which was relatively low and also the level of high-frequency power applied was 0.05 kW which was relatively low, although the treatment time was 300 seconds which was relatively long, the proportion of the broad component within the crystal organization of the intermediate layer was 20%, showing a relatively favorable level of orientation properties.

Further, with respect to the sample obtained in Experimental Example 13, as with Experimental Example 12, since the gas pressure in the pretreatment step was 0.08 Pa which was relatively low and also the level of high-frequency power applied was 0.02 kW which was relatively low, although the treatment time was 300 seconds which was relatively long, the proportion of the broad component within the crystal organization of the intermediate layer was 19.1%, showing a relatively favorable level of orientation properties.

In addition, with respect to the sample obtained in Experimental Example 14, as with the above-mentioned Experimental Examples 12 and 13, since the gas pressure in the pretreatment step was 0.08 Pa which was relatively low and also the level of high-frequency power applied was 1 kW which was higher than that applied in the above-mentioned Experimental Examples 12 and 13, although the treatment time was 300 seconds which was relatively long, the proportion of the broad component within the crystal organization of the intermediate layer was 83.99%, showing an unfavorable level of orientation properties.

Further, with respect to the sample obtained in Experimental Example 15, since the level of high-frequency power applied was 0.2 kW which was relatively high and also the gas pressure in the pretreatment step was 0.08 Pa which was relatively low and also the treatment time was 300 seconds which was relatively long, the proportion of the broad component within the crystal organization of the intermediate layer was 95.9%, showing a highly unfavorable level of orientation properties.

Note that as shown in the results in the above Table 2 where the properties of crystals of the intermediate layer were analyzed, it is apparent that there is no correlation between the proportion of the broad component within the crystal organization of the intermediate layer, in other words, the orientation properties, and the full width at half maximum in the XRC for the intermediate layer. For example, with respect to the samples obtained in Experimental Examples 5 and 11, although the full width at half maximum in the XRC were 0.1157 (Experimental Example 5) and 0.1233 (Experimental Example 11), respectively, which were at relatively favorable levels, the proportions of the broad component were 50.4% (Experimental Example 5) and 60.7% (Experimental Example 11), respectively, and the levels of XRC for the GaN layer (the base layer) were 90.7 arcsec (Experimental Example 5) and 108.4 arcsec (Experimental Example 11), respectively, showing unfavorable levels of orientation properties.

From such results, it is apparent that it is substantially impossible to control the full width at half maximum in the XRC for the GaN layer (the base layer) formed on top of the intermediate layer and to thereby improve the crystallinity of this GaN layer by using the full width at half maximum in the XRC for the intermediate layer as an indicator.

In contrast, the present inventors had discovered, as shown in the above results, that the proportion of the broad (non-orientating) component within the crystal organization of the intermediate layer and the full width at half maximum in the XRC for the GaN layer (the base layer) formed on the intermediate layer were correlated. In addition, by using the proportion of the broad component in the intermediate layer as an indicator, the crystallinity of the base layer formed thereon was controlled in a favorable manner, and by further controlling the levels of crystallinity for the respective layers formed thereon in a favorable manner, the light emitting device and the manufacturing method thereof according to the present invention were completed.

INDUSTRIAL APPLICABILITY

Because the method for manufacturing a group III nitride semiconductor light emitting device according to the present invention is capable of forming a group III nitride semiconductor with a favorable level of crystallinity, the method can be applied for manufacturing various semiconductor devices including the electronic devices such as a field-effect transistor (FET), in addition to the light emitting devices such as a light emitting diode (LED) and a laser diode (LD).

The invention claimed is:

1. A method for manufacturing a group III nitride semiconductor light emitting device which is a method for manufacturing a group III nitride semiconductor light emitting device, in which at least an intermediate layer composed of a group III nitride compound is laminated on a substrate and an n-type semiconductor layer having a base layer, a light emitting layer and a p-type semiconductor layer are sequentially laminated on the intermediate layer, the method comprising:
   a pretreatment step in which the substrate is subjected to a plasma treatment; and
   a sputtering step following the pretreatment step in which the intermediate layer is formed on the substrate using a sputtering process,
   wherein when components are separated, based on a peak separation technique using an X-ray rocking curve of the intermediate layer, into a broad component that corresponds to a non-orientating component included in a crystal organization of the intermediate layer and having a full width at half maximum of 720 arcsec or more and a narrow component, the sputtering step forms the intermediate layer so that a proportion of the non-orientating component within the crystal organization of the intermediate layer is 30% or less in terms of an area ratio of the intermediate layer, and
   wherein the pretreatment is performed at a temperature ranging from 300 to 800° C.

2. The method for manufacturing a group III nitride semiconductor light emitting device according to claim 1, wherein the plasma treatment in the pretreatment step is a reverse sputtering process.

3. The method for manufacturing a group III nitride semiconductor light emitting device according to claim 2, wherein in the pretreatment step, a reverse sputtering process is carried out by generating a plasma through a power source using a high frequency.

4. The method for manufacturing a group III nitride semiconductor light emitting device according to claim 3, wherein the pretreatment step includes carrying out of a reverse sputtering process by generating a nitrogen plasma through a power source using a high frequency.

5. The method for manufacturing a group III nitride semiconductor light emitting device according to claim 3, wherein in the pretreatment step, a reverse sputtering process is carried out by applying a high frequency power of 0.1 kW or less to the substrate.

6. The method for manufacturing a group III nitride semiconductor light emitting device according to claim 1, wherein in the sputtering step, a source material containing a group V element is used.

7. The method for manufacturing a group III nitride semiconductor light emitting device according to claim 6, wherein the group V element is nitrogen.

8. The method for manufacturing a group III nitride semiconductor light emitting device according to claim 6, wherein ammonia is used as the source material containing a group V element.

9. The method for manufacturing a group III nitride semiconductor light emitting device according to claim 1, wherein the pretreatment step is carried out by circulating a nitrogen-containing gas inside a chamber.

10. The method for manufacturing a group III nitride semiconductor light emitting device according to claim 9, wherein a ratio of nitrogen gas within the nitrogen-containing gas circulated inside a chamber in the pretreatment step is 50% or more.

11. The method for manufacturing a group III nitride semiconductor light emitting device according to claim 1, wherein in the sputtering step, the intermediate layer is formed by a radio-frequency (RF) sputtering process.

12. The method for manufacturing a group III nitride semiconductor light emitting device according to claim 11, wherein in the sputtering step, the intermediate layer is formed using an RF sputtering process while moving a magnet of a cathode.

13. The method for manufacturing a group III nitride semiconductor light emitting device according to claim 1, wherein the pretreatment step is carried out by setting a pressure inside a chamber at 1 Pa or more.

14. The method for manufacturing a group III nitride semiconductor light emitting device according to claim 1, wherein the pretreatment step is carried out by setting a treating time to 30 seconds or less.

15. The method for manufacturing a group III nitride semiconductor light emitting device according to claim 1, wherein the pretreatment step and the sputtering step are carried out in the same chamber.

16. The method for manufacturing a group III nitride semiconductor light emitting device according to claim 1, wherein in the sputtering step, the intermediate layer is formed so as to cover at least 90% of the surface of the substrate.

17. The method for manufacturing a group III nitride semiconductor light emitting device according to claim 1, wherein in the sputtering step, the intermediate layer is formed by a reactive sputtering process in which a source material containing a group V element is circulated inside a reactor.

18. The method for manufacturing a group III nitride semiconductor light emitting device according to claim 1, wherein in the sputtering step, the intermediate layer is formed by setting a temperature of the substrate within a range from 400 to 800° C.

19. The method for manufacturing a group III nitride semiconductor light emitting device according to claim 1, wherein the base layer is formed on the intermediate layer by a metal organic chemical vapor deposition (MOCVD) method.

20. The method for manufacturing a group III nitride semiconductor light emitting device according to claim 1, wherein the base layer is formed on the intermediate layer by a reactive sputtering process.

21. The method for manufacturing a group III nitride semiconductor light emitting device according to claim 1, wherein the base layer is formed by setting a temperature of the substrate within a range from 300 to 1,200° C.

22. A group III nitride semiconductor light emitting device obtained by the manufacturing method according to claim 1.

\* \* \* \* \*